United States Patent
Arai et al.

(10) Patent No.: US 8,698,193 B2
(45) Date of Patent: *Apr. 15, 2014

(54) LIGHT EMITTING DEVICE AND METHOD FOR MANUFACTURING THE SAME

(75) Inventors: Nobutoshi Arai, Osaka (JP); Masatomi Harada, Osaka (JP); Kouichirou Adachi, Osaka (JP); Hiroshi Iwata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1295 days.

This patent is subject to a terminal disclaimer.

(21) Appl. No.: 12/510,470

(22) Filed: Jul. 28, 2009

(65) Prior Publication Data

US 2010/0026198 A1    Feb. 4, 2010

(30) Foreign Application Priority Data

Jul. 29, 2008  (JP) ................................ 2008-195249
Dec. 5, 2008   (JP) ................................ 2008-311105
Dec. 10, 2008  (JP) ................................ 2008-314587

(51) Int. Cl.
    *H01L 29/80*    (2006.01)

(52) U.S. Cl.
    USPC ........................................................ 257/103

(58) Field of Classification Search
    USPC ................... 315/169.1, 169.3; 257/102, 103, 257/E33.061, E33.062, E33.064, E33.067; 438/22

See application file for complete search history.

(56) References Cited

U.S. PATENT DOCUMENTS

| | | | | |
|---|---|---|---|---|
| 3,902,185 A * | 8/1975 | Hayakawa | ................ | 345/207 |
| 6,445,126 B1 * | 9/2002 | Arai et al. | ................ | 313/504 |
| 7,138,660 B2 * | 11/2006 | Ota et al. | ................ | 257/79 |
| 7,227,190 B2 * | 6/2007 | Yasukawa et al. | ................ | 257/79 |
| 7,256,427 B2 * | 8/2007 | Daniels | ................ | 257/89 |
| 8,421,116 B2 * | 4/2013 | Arai et al. | ................ | 257/103 |
| 2006/0124942 A1 * | 6/2006 | Maeda et al. | ................ | 257/89 |
| 2007/0215880 A1 | 9/2007 | Sakata et al. | | |

FOREIGN PATENT DOCUMENTS

| | | |
|---|---|---|
| JP | 11-310776 A | 11/1999 |
| JP | 2001-326072 A | 11/2001 |
| JP | 2006-120555 A | 5/2006 |
| JP | 2006-173010 A | 6/2006 |
| JP | 2006-228722 A | 8/2006 |
| JP | 2007-265986 A | 10/2007 |

OTHER PUBLICATIONS

Arai et al., "Germanium nanoparticles formation in silicon dioxide layer by multi-energy implantation of Ge negative ions and their photo-luminescence," Materials Science and Engineering B, Switzerland, vol. 147, Feb. 15, 2008, pp. 230-234.

(Continued)

*Primary Examiner* — Minh D A
(74) *Attorney, Agent, or Firm* — Birch, Stewart, Kolasch & Birch, LLP

(57) ABSTRACT

The light emitting device of the invention includes a first electrode, a second electrode, and a carrier formed between the first electrode and the second electrode and containing germanium light emitters, wherein the germanium light emitters contain germanium oxide in which at least part of the germanium oxide has oxygen deficiency and have a wavelength peak of emission in both or either the range of 250 to 350 nm and/or the range of 350 to 500 nm when a potential difference is applied to the first electrode and the second electrode.

34 Claims, 17 Drawing Sheets

(56) References Cited

OTHER PUBLICATIONS

Rebohle et al., "Strong blue and violet photoluminescence and electroluminescence from germanium-implanted and silicon-implanted silicon-dioxide layers," Appl. Phys. Lett., vol. 71, No. 19, Sep. 15, 1997, pp. 2809-2811.

Rebohle et al., "Ion beam synthesized nanoclusters for silicon-based light emission", Nuclear Instruments and Methods in Physics Research. Section B. 2002, vol. 188, pp. 28-35.

"Latest Trend of Inorganic EL Developments, Material Properties and Fabrication Techniques/Application Expansion," 1st Edition, Information Organization, Mar. 27, 2007.

\* cited by examiner

LIGHT EMITTING DEVICE AND METHOD FOR MANUFACTURING THE SAME

CROSS-REFERENCE TO RELATED APPLICATION

This application is related to Japanese Patent Application Nos. 2008-195249 filed on Jul. 29, 2008, 2008-311105 filed on Dec. 5, 2008 and 2008-314587 filed on Dec. 10, 2008, whose priorities are claimed under 35 USC §119, and the disclosures of which are incorporated by reference in its entirety.

BACKGROUND OF THE INVENTION

1. Field of the Invention

The invention relates to a light emitting device easy to be manufactured and emitting light in a short wave range of about 300 nm or 400 nm or both of them, a method for using the same and a method for manufacturing the same.

2. Description of the Related Art

Inorganic electroluminescent (EL) devices, as self-emitting light sources, have been expected for usage as new display devices or the like with no need of separate illumination sources.

There are two types, "dispersion type" and "thin film type", for conventional EL devices and many of them emit light by an AC operation.

With respect to conventional dispersion type and thin film type EL devices, inorganic EL devices disclosed in Japanese Unexamined Patent Publication No. 2007-265986 and "Latest Trend of Inorganic EL Developments, Material Properties and Fabrication Techniques/Application Expansion, 1st edition, Information Organization, March 27 (2007)" have been developed by using inorganic compounds.

The conventional dispersion type EL devices emit light by phosphor particles with applying an AC voltage to devices containing phosphor particles (e.g. ZnS: Cu, Cl, etc.) shut out of an electric circuit between electrodes. It is supposed that a particle diameter of the phosphor particles is optimum to be about 10 μm and it has been known that if the diameter becomes smaller than 2 to 3 μm, emission luminance is considerably lowered. In this connection, the dispersion type EL devices are supposed to emit light due to donor-acceptor pair recombination.

Further, the conventional thin film type EL devices emit light by light emitting layer with applying an AC voltage to devices having a light emitting layer (e.g. ZnS: Mn; base material ZnS doped with emission center Mn) of a phosphor sandwiched by insulating layers between electrodes. In this connection, the thin film type EL devices are supposed to emit light due to collision excitation of an emission center by hot electrons running in a base material.

On the other hand, techniques of producing a light emitting device on a semiconductor substrate, particularly a silicon substrate, have actively been developed. Since a CMOS circuit, which is an information processor and a storage unit or the like, is manufactured by using a semiconductor including mainly silicon as a base, if a light emitting device could be manufactured simultaneously with other functional devices such as a transistor or the like on a substrate of silicon, etc., the light emitting device could be formed together with the information processor and storage unit on a single substrate. Accordingly, it is highly expected that an inter-chip communication by light and optical computing techniques are made possible and it leads to further developments of digital electronic appliances.

For example, Japanese Unexamined Patent Publication No. Hei 11(1999)-310776 discloses confirmation of electroluminescence having a peak at about 650 nm by forming fine particles of silicon in a nano-meter order in a silicon nitride film (an insulator) on a silicon substrate and applying a voltage to the silicon nitride film.

In addition, with respect to a conventional light emitting device containing fine particles in an insulating film, it is necessary to apply a voltage as high as about 100 V between both sides of the insulating film and thus apply an intense electric field of about 7 MV/cm to the insulating film. Accordingly, electrons of electrodes are supplied to a conduction band of the insulating film by FN (Fowler-Nordheim) tunneling and after being accelerated in the electric field to have sufficient kinetic energy, the electrons collide against the fine particles. The collided electrons excite electrons of the fine particles and the excited electrons are supposed to emit light.

Among conventional inorganic EL, there are also materials which emit blue light in about 460 to 480 nm; however they require a high voltage of about 100 V or higher, and moreover they are not enough to give sufficient luminance.

However, emission of light emitting devices in which fine particles are formed in a conventional insulating film as disclosed in Japanese Unexamined Patent Publication No. Hei 11(1999)-310776 is in a visible light region and almost all of them emit light such as red light in a relatively long wavelength range and luminance, surface area, evenness of emission, and the like sufficient for practical use have not yet been actually accomplished. In terms of actualization of independent illumination in place of a display and a fluorescent lamp, a light emitting device having a shorter wavelength region, sufficient luminance and surface area, and capable of evenly emitting light has highly been desired.

Further, there is a problem that the conventional light emitting device in which fine particles are formed in an insulating film unevenly emits light.

SUMMARY OF THE INVENTION

In view of the above state of the art, it is an object of the invention to provide a light emitting device easy to be manufactured and capable of emitting light in a short wavelength range particularly from ultraviolet to blue color (about 250 to 500 nm).

A light emitting device of the invention has a first electrode, a second electrode, and a carrier formed between the first electrode and the second electrode and containing germanium light emitters, wherein the germanium light emitters contain germanium oxide in which at least part of the germanium oxide has oxygen deficiency and have a wavelength peak of emission in both or either the range of 250 to 350 nm and/or the range of 350 to 500 nm when a potential difference is applied to the first electrode and the second electrode.

The inventors of the invention have actively made investigations and have found that when a potential difference is applied to a device having germanium light emitters including germanium oxide in which at least part of the germanium oxide has oxygen deficiency in a carrier, the device is enabled to emit light and the electroluminescence has a wavelength peak in either one or both of the range of 250 to 350 nm and the range of 350 to 500 nm.

Further, the inventors of the invention investigated more in detail on conditions of manufacture and a state of this device and accordingly have found that the device can stably and efficiently emit light by providing the device with clusters or fine particles containing germanium atoms and oxygen atoms (hereinafter, including clusters, referred to as germanium fine particles). Furthermore, the inventors have found that the emission wavelength scarcely depends on a size of the fine particles and a light emitting mechanism of this device is not owing to a quantum size effect of the fine particles, which has been assumed conventionally before, but it is due to oxygen deficiency of germanium oxide and these findings have now led to completion of the invention.

The light emitting device of the invention has an advantage that it can be manufactured by a very simple method for manufacturing, for example, involving ion implanting germanium to a carrier and thereafter carrying out a heat treatment.

BRIEF DESCRIPTION OF THE DRAWINGS

FIG. 18A: a schematic cross-sectional view of a light emitting device using carbon nanotubes as projections; FIG. 18B: a schematic cross-sectional view of a light emitting device forming conical projections; and FIG. 18C: a schematic cross-sectional view of a light emitting device in which voltage is applied between a first electrode and a second electrode;

FIG. 21A: a plane view of a substrate in which a comb-like n-type semiconductor part is formed; FIG. 21B: a plane view of a substrate in which a curb-like n-type semiconductor part is formed.

DESCRIPTION OF PREFERRED EMBODIMENTS

Figure 1:
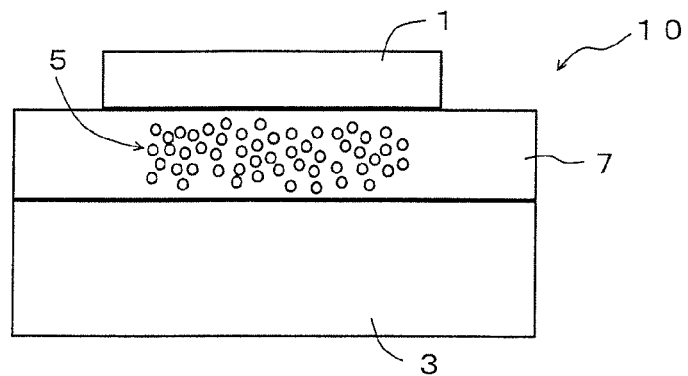
FIG. 1: a cross-sectional view showing a structure of a light emitting device of an embodiment of the invention.

Further, in a case of the light emitting device based on the quantum size effect as an emission principle, if a size of the particles is changed, the emission wavelength is also changed; however since the particle size is easy to be changed in accordance with conditions of manufacture, for example, germanium implantation quantity, a heat treatment temperature, a duration of the heat treatment, etc., it is not easy to make particle size even and accordingly, it is not easy to suppress product variation to narrow. Further, depending on use environments, even slight alteration of a particle diameter with lapse of time leads to alteration of the emission wavelength and thus it is not easy to attain reliability of a product. These problems are further difficult to be solved in a blue color region and an ultraviolet region since wavelength fluctuation because of particle diameter alteration is more significant as the wavelength becomes shorter.

On the other hand, the light emitting device of the invention is supposed to emit light while using germanium oxide in which at least part of the germanium oxide has oxygen deficiency as an emission center and even if the particle size is changed, the emission wavelength is not changed. Accordingly, it is made easy by the invention to narrow product variation.

The maximum value of a ratio of the germanium oxide having oxygen deficiency to an entire germanium oxide may be 0.1 or higher.

The germanium fine particles may be made of germanium in its center part and the germanium oxide in which at least part of the germanium oxide has oxygen deficiency may be arranged in circumference of the center part.

The maximum particle diameter of the germanium fine particles may be 1 to 20 nm.

The carrier may have a transmittance of light with a wavelength range of 250 nm or longer and 350 nm or shorter or a wavelength range of 350 nm or longer and 500 nm or shorter or both ranges of 50% or higher and 99.99% or lower.

The carrier may be an insulator.

The carrier may be made of silicon oxide, silicon nitride or silicon oxynitride.

A region where the germanium light emitters exist may be apart at 5 nm or more and 15 nm or less from the first electrode or the second electrode or both of them.

The second electrode may have a transmittance of light with a wavelength of 250 nm or longer and 350 nm or shorter or wavelength of 350 nm or longer and 500 nm or shorter or both ranges of 60% or higher and 99.99% or lower.

The second electrode may be made of a metal oxide thin film, a metal thin film, or a semiconductor thin film.

The second electrode may have a perforated structure such as a slit structure or a porous structure.

The second electrode having a perforated structure may be made of conductive nano-wires.

The light emitting device may further have a means for limiting the maximum electric current flowing in the first and the second electrodes.

The means for limiting the maximum electric current may be an electric resistor connected electrically with the first or the second electrode.

The electric resistor may be a variable resistor.

Further, the invention also provides a method for using the light emitting device, wherein an AC voltage is applied to the first and the second electrodes. It is experimentally found that durability of the light emitting device of the invention is improved in a case where an AC voltage is applied.

Further, it is experimentally found that the durability of the light emitting device of the invention is remarkably improved in a case where electric current is limited.

Further, the invention also provides a method for using the light emitting device, wherein a DC voltage is applied between the first electrode and the second electrode. It is experimentally found that the light emitting device of the invention can emit light even at a low voltage in a case where the DC voltage is applied.

Further, the invention also provides a method for manufacturing the light emitting device, wherein germanium light emitters are obtained by forming a region with 1.5 to 20% by atom of germanium concentration in the carrier and thereafter carrying out a heat treatment. It is experimentally found that emission intensity can be increased by adding germanium in an amount in the range.

The germanium light emitters may be formed by making germanium fine particles and then oxidizing the particles.

The region may be formed by ion implantation of germanium.

The germanium to be ion-implanted may be negatively ionized or neutrally ionized before implantation.

The ion implantation may be carried out by implantation of a plurality of times with changed implantation energy.

The region may be formed by simultaneously depositing silicon oxide and germanium.

The region may be formed by coating or spraying a mixture of silicon oxide and germanium.

The region may be formed by coating or spraying germanium oxide.

Before the heat treatment, the carrier formed the region may be exposed to water.

The heat treatment may include a first heat treatment conducted in an inert atmosphere and then a second heat treatment conducted in an oxidizing atmosphere.

The temperature of the heat treatment may be 400° C. or higher and 1200° C. or lower.

An atmosphere of the heat treatment may contain $H_2O$.

Further, the invention also provides a light emitting device usable for solid state illumination and displays. If the light emitting device is used as a light emitting source, it is relatively easily made possible to make displays flexible, lightweight, and thin.

Hereinafter, an embodiment of the invention will be described with reference to drawings. The drawings and the contents described below are illustrative and a scope of the invention is not limited to the drawings and following descriptions.

1. First Embodiment 1-1. Light Emitting Device

A light emitting device of one embodiment of the invention will be described with reference to FIG. 1. FIG. 1 is a cross-sectional view showing a structure of a light emitting device 10 of this embodiment.

The light emitting device 10 of this embodiment has a first electrode 1, a second electrode 3, and a carrier 7 formed between the first electrode 1 and the second electrode 3 and containing germanium light emitters 5, wherein the germanium light emitters 5 contain germanium oxide in which at least part of the germanium oxide has oxygen deficiency and have a wavelength peak of emission in both or either the range of 250 to 350 nm and/or the range of 350 to 500 nm when a potential difference is applied to the first electrode 1 and the second electrode 3. When a voltage is applied between the first electrode 1 and the second electrode 3, light is emitted from the carrier 7 containing the germanium light emitters 5.

1-1-1. First Electrode and Second Electrode

The first electrode 1 and the second electrode 3 are not particularly limited in their configurations if they can apply a voltage to the carrier 7. For example, they are made of a metal or a semiconductor. The first electrode 1 and the second electrode 3 may be made of the same material or different materials. In order to improve a light extraction efficiency from the carrier 7, at least one of the first electrode 1 and the second electrode 3 is preferable to be transparent to an emission wavelength. They may be electrodes having a transmittance of light with a wavelength range of 250 nm to 350 nm or a wavelength range of 350 nm to 500 nm or both ranges of 60% or higher and 99.99% or lower and are not particularly limited. Usable is, for example, a metal oxide thin film of ITO or the like; a metal thin film of Al, Ti, Ta, or the like; or a semiconductor thin film of Si, SiC, GaN, or the like. As an example, the first electrode 1 is made of an ITO electrode formed on the carrier 7 and the second electrode 3 is made of a conductive silicon substrate on opposite to the first electrode 1 sandwiching the carrier 7 between them. Further, for example, the first electrode 1 or the second electrode 3 may be formed on a substrate. The substrate may be any of an insulating substrate, a semiconductor substrate, and a conductive substrate and may be eliminated. If a large surface area such as illumination or displays but not electronic circuits is required, silicon oxide may be formed by CVD or a coating manner or another insulator or the like may be used.

With respect to another example, the first electrode 1 has a perforated structure such as a slit structure or a porous structure. A transmittance of many transparent conductive films to light with short wavelength particularly 300 nm or shorter may considerably be lowered. In order to reliably attain a permeation property, it is required to make the electrode an extremely thin film. However, if it is made an extremely thin film, an electric resistance may possibly be increased. Therefore, a metal thin film of Al or the like with a low resistance may be used. If a metal is made to be an extremely thin film, it can transmit light with short wavelength. More preferably, for example, a conductor such as ITO and Al is formed to be a film in a lattice-like state and therefore, a potential difference is obtained by the conductor and the generated light with short wavelength can be extracted from a point where an conductor is not formed.

Conductive nano-wires may be used for producing an electrode with the perforated structure. For example, a solution obtained by dispersing nano-wires is coated and dried to properly overlap the nano-wires and form a structure having gaps. As the nano-wires, silicon is usable and preferably usable are silicon nano-wires with improved conductivity by doping, carbon nanotubes, or metal nano-rods.

1-1-2. Carrier

The carrier 7 is not particularly limited in its configuration if it can carry the germanium light emitters 5. A light transmittance of the carrier 7 is not particularly limited; however the transmittance of light with a wavelength range of 250 nm to 350 nm or in a wavelength range of 350 nm to 500 nm or both ranges is preferably 50% or higher and 99.99% or lower. Since a peak wavelength of light emitted from the carrier 7 containing the germanium light emitters 5 is around 300 or about 400 nm, if the transmittance of light with a wavelength range of 250 to 350, or a wavelength range of 300 to 500 nm, or both ranges is high, light extraction efficiency is heightened correspondingly. Further, a material for the carrier 7 is not particularly limited; however the carrier 7 is preferably made of an insulating body. In this case, since electric current flowing between electrodes can be lowered without contributing to emission, effective emission efficiency can be improved and therefore, emission is made possible with saved power consumption. Further, the carrier 7 is more preferably made of silicon oxide, silicon nitride or silicon oxynitride. In this case, the carrier is a silicon type insulating film and silicon is easier to be bonded with oxygen than germanium and therefore, a germanium atom is not unnecessarily bonded with an oxygen atom and also silicon oxide, silicon nitride or silicon oxynitride is relatively hard to transmit oxygen and therefore, a germanium atom is not oxidized by outside air permeation and consequently, emission can be stabilized and is scarcely deteriorated. Further, silicon oxide, silicon nitride or silicon oxynitride can be formed into a film in common silicon semiconductor process and is therefore excellent in mass productivity and moreover made possible to be combined with another electronic circuit. Further, the carrier 7 is particularly preferably made of silicon oxide. As a result of experiments, it is found that since silicon nitride is hard to permeate oxygen, it is slightly difficult to carry out oxidation after germanium is deposited on the carrier. In a case of silicon oxide or silicon oxynitride, germanium oxide can be produced to an extent of giving sufficient emission intensity at a low temperature in a short time as compared with a case of silicon nitride. Further, in this case, the carrier 7 can be formed easily by heat oxidation of silicon substrate, which is the second electrode 3. Accordingly, the substrate and the carrier 7 are preferably a silicon substrate and a silicon heat oxidized film formed thereon, respectively.

1-1-3. Germanium Light Emitters

The germanium light emitters 5 are not particularly limited if they contain germanium atoms and become a light emitting source and are, for example, germanium fine particles. The germanium fine particles are fine particles containing germanium atoms. Further, the germanium light emitters 5 may be germanium fine particles which are at least partly oxidized. The germanium light emitters 5 are preferably fine particles containing germanium and an oxide thereof as main components, more preferably fine particles containing substantially only germanium and an oxide thereof, and even more preferably fine particles containing substantially only a germanium oxide.

According to experiments of inventors of the invention, it is made apparent that as compared with a light emitting device in which germanium oxide is produced by thermally oxidizing a germanium substrate or implanting germanium atoms into a carrier by ion implantation or the like and thereafter oxidizing the germanium atoms, a light emitting device in which germanium oxide is produced by forming germanium fine particles in a carrier and then oxidizing the fine particles is excellent in both emission intensity and durability. It is supposed that germanium oxide in which at least part of the germanium oxide has oxygen deficiency is efficiently formed on surfaces of the fine particles and relatively stably exists thereon.

The germanium light emitters 5 are preferable to be contained in the carrier 7 and dispersed evenly in the carrier 7. The number density of the germanium light emitters 5 in the carrier 7 is not particularly limited. The germanium light emitters 5 may be contained in a number density of, for example, $1 \times 10^{16}/cm^3$ to $1 \times 10^{21}/cm^3$ in the carrier 7.

The germanium fine particles, which are the germanium light emitters 5, are preferable to have the maximum particle diameter of 1 to 20 nm. It is because emission efficiency is particularly heightened in this case. In the invention, "maximum particle diameter" means the largest particle diameter among particle diameters of those observed in a case where a range of a 100 nm square of an arbitrary cross section of the carrier 7 is observed by TEM observation (it may be a cross sectional view shown in FIG. 1 or a cross-sectional view vertical to paper). Further, in the invention, "particle diameter" means a length of the longest line where a plane image of a fine particle projected to a TEM photograph can include. The maximum particle diameter of the germanium fine particles, which are the germanium light emitters 5, may be, for example, 1, 2, 3, 4, 5, 6, 7, 8, 9, 10, 11, 12, 13, 14, 15, 16, 17, 18, 19 or 20 nm. The maximum particle diameter of the germanium fine particles, which are the germanium light emitters 5, may be in a range between whichever two numerals exemplified above and may be whichever one numeral value or lower.

The germanium fine particles, which are the germanium light emitters 5, contain germanium oxide and at least part of the germanium oxide has oxygen deficiency. A germanium atom has four bonds and therefore when the respective bonds are bonded with oxygen atoms, four oxygen atoms are to be bonded to each germanium atom. Germanium oxide in such a state is called as "germanium oxide having no oxygen deficiency" or "$GeO_2$". On the other hand, in accordance with an oxidation degree of germanium, only some of four bonds of each germanium atom may be bonded with oxygen atoms and remaining may be left unbonded (that is, in a state of not bonded with oxygen atom). Germanium oxide in such a state is called as "germanium oxide having oxygen deficiency" or "GeO".

The sites where GeO exists are not particularly limited and GeO may be arranged on surfaces of the germanium fine particles. For one example, Ge is in a center part and surrounding periphery is covered with GeO. Further, GeO may be covered with $GeO_2$.

Figure 2:
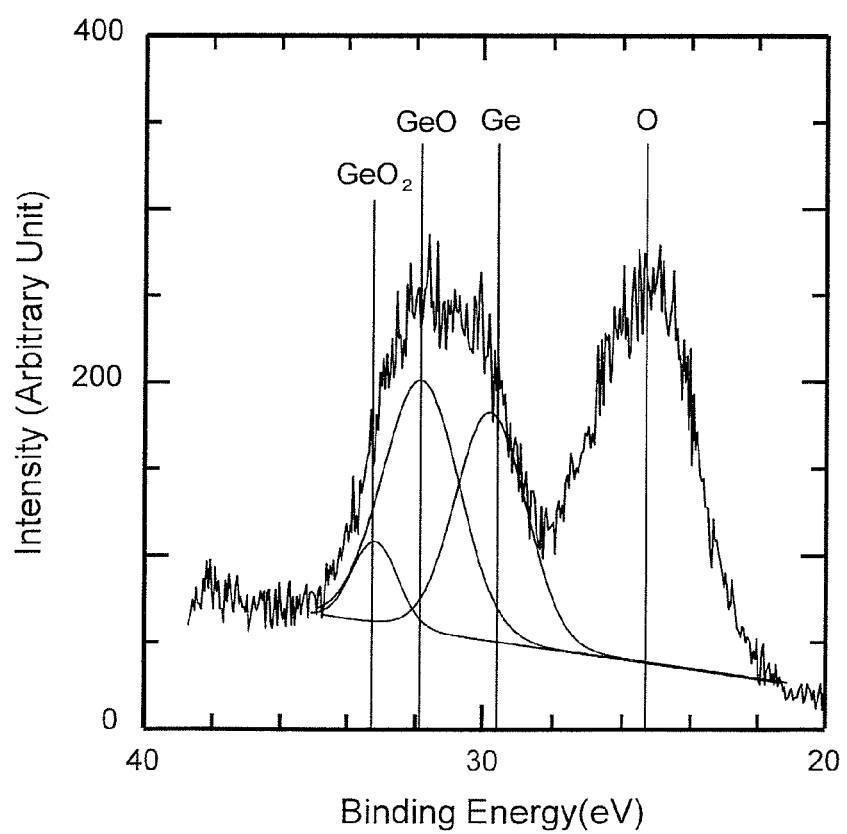
FIG. 2: one example of XPS spectra for explaining Gauss fitting.

A ratio of germanium oxide having oxygen deficiency (GeO) to an entire germanium oxide ($GeO_2$+GeO) contained in the germanium light emitters 5 (hereinafter, also referred to as "oxygen deficiency ratio") can be determined by measuring peak surface area $S_{GeO2}$ attributed to $GeO_2$ and peak surface area $S_{GeO}$ attributed to GeO in a spectrum near 3d peak of an XPS spectrum and calculating $S_{GeO}/(S_{GeO2}+S_{GeO})$. As an X-ray source for XPS measurement, for example, Al Kα-ray (1486.6 eV) made monochromatic can be employed. The peak attributed to $GeO_2$ and the peak attributed to GeO are overlapped in skirt parts; however Gauss fitting may be carried out as shown in FIG. 2 to separate a waveform of the peak attributed to $GeO_2$ and the peak attributed to GeO and thus the surface areas $S_{GeO2}$ and $S_{GeO}$ can be measured. Peak energies of $GeO_2$ and GeO are about 33.5 and 32 eV, respectively.

Since it is made clear that GeO is involved in emission by experiments of the inventors of the invention, it is supposed that emission efficiency becomes higher as an oxygen deficiency rate is higher. The maximum oxygen deficiency ratio is not particularly limited; however it is preferably 0.1 or higher. It is because if this maximum value is too low, emission may sometimes be impossible or emission intensity may become too low. The maximum value may be, for example, 0.1, 0.2, 0.3, 0.4, 0.5, 0.6, 0.7, 0.8, 0.9, 0.95, 0.99, or 1. The maximum value may be in a range of whichever two numeral values exemplified herein.

An average value of the oxygen deficiency rate is not particularly limited; however it is preferably 0.1 or higher. It is because if this average value is too low, emission may sometimes be impossible or emission intensity may become too low. The average value may be, for example, 0.1, 0.2, 0.3, 0.4, 0.5, 0.6, 0.7, 0.8, 0.9, 0.95, 0.99, or 1. The average value may be in a range of whichever two numeral values exemplified herein. The average value of the oxygen deficiency rate is measured in a range of 1/100 or higher of a peak value of the number density of the germanium fine particles, which are germanium light emitters 5. The average value of the oxygen deficiency rate can be measured specifically by, for example, measuring the oxygen deficiency rate at a plurality of points at constant intervals in the depth direction of the carrier 7 and carrying out calculation of algebraic mean of the obtained measured values. The intervals of the points where measurement is carried out is preferable to be as narrow as possible and for example, it is 10 nm or narrower. The oxygen deficiency rate measurement may be carried out, for example, every time when the carrier 7 is etched for a prescribed duration in the same condition. An etching condition may be, for example, argon etching at 4 keV for 5 minutes.

Incidentally, in a spectrum near 2p peak of Ge in the XPS spectrum, oxidation ratio of Ge can be determined by measuring peak surface area $S_{Ge}$ attributed to germanium (Ge) and peak surface area $S_{oxidizedGe}$ attributed to germanium oxide ($GeO_2$+GeO) and calculating $S_{GeO}/(S_{Ge}+S_{oxidizedGe})$. Further, an average value of an oxidation rate can be calculated in the same manner as in the calculation of the average value of the oxygen deficiency rate. The average value of the oxidation rate is not particularly limited; however it may be, for example, 1, 5, 10, 15, 20, 25, 30, 34.9, 35, 40, 45, 50, 55, 60, 60.1, 65, 70, 70.1, 75, 80, 85, 90, 95, 99, 100%. The average value of the oxidation rate may be in a range between whichever two numeral values exemplified herein.

A method for adding germanium fine particles, which are the germanium light emitters 5, in the carrier 7 is not particularly limited; however, as one example, it is supposed to be a method of forming a region containing germanium in the carrier 7 by ion implantation of germanium into the carrier 7 and thereafter carrying out a heat treatment such that germanium oxide having at least partial oxygen deficiency is formed. Germanium atoms are oxidized by the heat treatment after the ion implantation to form germanium oxide having at least partly oxygen deficiency. Implanted germanium atoms are diffused and agglomerated in accordance with heat treatment conditions and implantation conditions and a large number of fine particles are formed in the carrier 7. The germanium ion implantation may be carried out in conditions of, for example, implantation energy of 5 to 100 eV and implantation amount of $1 \times 10^{14}$ to $1 \times 10^{17}$ ions/cm$^2$.

An oxygen deficiency rate can properly be controlled by changing a germanium implantation amount, a heat treatment time, a heat treatment temperature, a heat treatment atmosphere and the like. Specifically, the oxygen deficiency rate can be increased by controlling a partial pressure and flow rate of oxygen in the heat treatment atmosphere. For example, in a case where an atomic concentration of germanium in silicon oxide with a film thickness of 100 nm is 10% or lower, in a heat treatment at 800° C. for 1 hour, if an inert gas is supplied (50 ml/min) while vacuum evacuation is carried out (400 ml/min), although partially bonded with oxygen, germanium is not completely oxidized since oxygen is insufficient and oxygen deficiency may be generated. In the atmosphere of 1 atm containing an inert gas mixed with 20% by volume of oxygen, oxygen supply is so much as to decrease the oxygen deficiency. Although depending on other parameters such as germanium implantation conditions and a heat treatment time and temperature, an atmosphere proper for increasing the oxygen deficiency rate can increase, for one example, the oxygen deficiency rate by relatively increasing the atomic concentration of germanium and supplying an inert gas mixed with oxygen while vacuum evacuation is carried out.

Further preferably, the heat treatment may involve a first heat treatment in inert atmosphere and thereafter a second heat treatment in oxidizing atmosphere. In one example, in a case where an atomic concentration of germanium in silicon oxide with a film thickness of 50 nm is 2 to 5% by atom, in a heat treatment at 700° C. for 1 hour, if an inert gas is supplied (50 ml/min) while vacuum evacuation is carried out (400 ml/min) and thereafter, in a heat treatment at 700° C. for 1 hour, if an inert gas containing 20% by volume of oxygen is supplied (10 ml/min) while vacuum evacuation is carried out (400 ml/min), germanium fine particles are formed and thereafter at least surfaces of the germanium fine particles are oxidized and thus germanium oxide having partial oxygen deficiency can be formed.

As a result of further experiments, it is found that in a case where the carrier is exposed to water before the heat treatment, emission intensity can be increased. It is supposed that production of germanium oxide having oxygen deficiency is promoted. The inventors of the invention have come up with an idea of adding $H_2O$ in an atmosphere for the heat treatment. Common heat treatment is carried out in a dry gas atmosphere; however if an experiment is carried out in slightly humid atmosphere, as expected, the emission intensity was increased.

Further, germanium is preferable to be added in a germanium concentration of 1.5 to 20% by atom in the carrier 7. It is because in a case where the heat treatment is carried out at 400° C. or higher and 1200° C. or lower, light emitting efficiency becomes relatively high in this range. In this connection, the heat treatment time may be conditioned easily in accordance with the heat treatment temperature and is shortened more as the temperature is increased more from a low temperature to a high temperature. The germanium concentration is specifically, for example, 1.5, 1.6, 1.7, 1.8, 1.9, 2, 3, 4, 5, 6, 7, 8, 9, 10, 11, 12, 13, 14, 15, 16, 17, 18, 19, and 20% by atom. The concentration may be in a range between whichever two numeral values exemplified herein. The germanium concentration can be measured by, for example, high dissolution RBS (Rutherford Back Scattering) method and besides, it can be measured by various analysis methods such as SIMS (Secondary Ion Mass Spectroscopy). A germanium concentration measurement is carried out in a range of $1/100$ of peak value or higher of the germanium concentration. The heat treatment temperature is preferably 600 to 900° C. and more preferably 700 to 800° C. for 1 hour. It is because if it is in this range, light emitting efficiency becomes relatively high. It is supposed that the temperature is proper to agglutinate, to oxidize the implanted germanium atoms and to recover defects other than germanium atom in the carrier at a time of implantation.

Germanium to be ion-implanted is preferable to be negatively ionized or neutralized before implantation. At a time of implantation of germanium, the inventors of the invention have relegated positive ion implantation and negative ion implantation of germanium into silicon substrates on which a heat oxidation film is formed in order to investigate a difference between a positive ion and a negative ion. As a result, light emitting devices manufactured by negative ion implantation of germanium show good light emitting characteristics whereas many of light emitting devices manufactured by positive ion implantation are inferior in the light emitting characteristics and some of them cannot be confirmed of emitting light. Therefore, a state of the positive ion implantation has been investigated in detail, and the inventors have received a reply that since the substrate is silicon, even if the oxidized film is a thin film, positive ion implantation is carried out commonly for a conductive substrate without electron shower. The inventors have come up with an idea of neutralization of ions and have relegated again positive ion implantation while conducting electron shower to manufacture light emitting devices. As a result, light emitting devices with good light emitting characteristics were obtained.

Further, ion implantation can be carried out a plurality of times while an energy is changed. In this case, a region with a germanium concentration proper for the light emitting device 10 of the invention can be formed more widely in the depth direction in the carrier 7. Accordingly, the emission region is widened in the depth direction and emission intensity per unit surface area can be increased.

Figure 3:
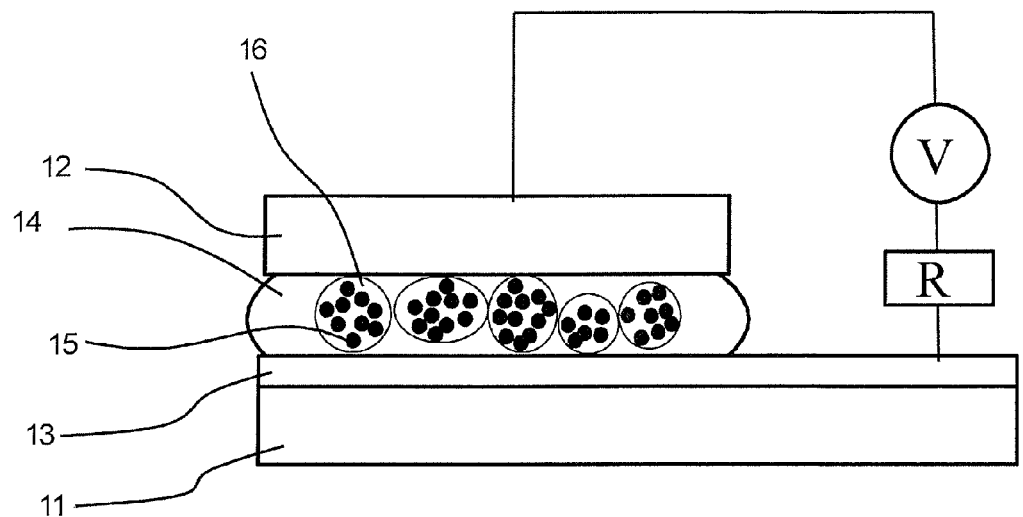
FIG. 3: a drawing for explaining a method for forming a region containing germanium in a carrier in accordance with the invention.

As a method for forming a region containing germanium in the carrier 7, besides ion implantation, the region can be formed by simultaneously or alternately depositing a material of the carrier and germanium. For example, silicon oxide and germanium may be deposited by a RF sputtering apparatus or silicon oxide and germanium may be deposited alternately by using a CVD apparatus. At that time, it is also possible to form a layer in fine particle state before film formation by shortening a deposition time of germanium. Alternatively, a mixture of silicon oxide and germanium produced previously or germanium oxide may be applied or sprayed to form the region. One example will be described with reference to FIG. 3. A material is previously produced by dispersing germanium oxide in silicon oxide by a method of ion implantation or heat treatment or the like and milled into fine particles with a size of about several tens nm or several hundreds nm by a ball mill method. The obtained fine particles of silicon oxide containing germanium oxide are applied or sprayed thinly on an ITO electrode 13 formed on a transparent substrate 11 such as glass. Thereafter, the fine particles are sandwiched with a conductive plate such as a silicon substrate 12 coated with an insulating liquid on its surface. Alternating current voltage is applied between the silicon substrate 12 and the ITO electrode 13 through a resistance for limiting electric current to obtain similar blue emitting light.

1-1-4. Emission Wavelength

The light emitting device 10 of this embodiment has electroluminescence (EL) with a wavelength peak in a range of 250 to 350 (more strictly 255 to 340 nm, 260 to 330 nm, 270 to 320 nm, 280 to 310 nm, or 285 to 300 nm) or in a range of 350 to 500 nm (more strictly 355 to 480 nm, 360 to 460 nm, 365 to 440 nm, 370 to 420 nm, 375 to 410 nm, 380 to 400 nm or 385 to 395 nm) or in both ranges in a case where a voltage is applied between electrodes.

1-1-5. Method for Using Light Emitting Device

The light emitting device 10 of this embodiment can emit light by voltage application between the first electrode 1 and the second electrode 3. The voltage to be applied may be a DC voltage or an AC voltage; however in a case where the AC voltage is applied, durability is provided. A waveform of the AC voltage is, for example, sinusoidal and a voltage thereof is, for example, 5 to 100 Vp-p and a frequency thereof is, for example, 0.02 Hz to 10 kHz. The voltage is specifically, for example, 5, 10, 15, 20, 25, 30, 40, 50, 60, 70, 80, 90, and 100 Vp-p. The voltage may be in a range between whichever two numeral values exemplified herein. The frequency is specifically, for example, 0.01 Hz, 0.1, 1, 10, 50, 60, 100, 1000, and 10000 Hz. The frequency may be in a range between whichever two numeral values exemplified herein.

The inventors of the invention have found that durability can be improved by electrically connecting a means for limiting the maximum electric current flowing between the first electrode 1 and the second electrode 3 with the first electrode 1 and the second electrode 3.

Usable as the means for limiting the maximum electric current may be an electric resistor electrically connected with the first electrode 1 or the second electrode 3. The electric resistor may be an electric resistor in an outside circuit electrically connected with a light emitting device.

Alternatively, a thin film of SiN or SiON may further be added between the carrier 7 and either the first electrode 1 or the second electrode 3 to give an electric resistor. For example, a thin film of SiN or SiON is deposited in about 5 nm by a CVD method after formation of the carrier and thereafter, the second electrode 3 may be formed. A film thickness is required to be adjusted in accordance with characteristics of a light emitting device.

Alternatively, a portion in a depth of several tens nm from an electrode surface of an electrode neighboring to the carrier 7 is made amorphous by ion implantation to produce a high resistant layer. For example, in a case where a silicon substrate is used as the first electrode 1 and germanium is to be implanted to the carrier 7 made of an oxide film on the silicon substrate, germanium is implanted to a certain extent into the first electrode 1, so that a portion with a relatively arbitrary depth from several nm to several tens nm from a surface of the first electrode 1 can be made amorphous.

Further, the electric resistor is preferably a variable resistor. As a result of experiments, it is found that emission intensity can be changed by changing an electric resistance value. In a case of the variable resistor, even if emission characteristics of a light emitting device are more or less uneven, the emission intensity can be made even by adjusting the electric resistance value connected electrically between the first electrode 1 and the second electrode 3.

Further, DC voltage application between the first electrode 1 and the second electrode 3 makes it possible to lower an operation voltage. As a result of detailed experiments, it is found that if a frequency is increased to an excess extent, luminance of emission is lowered. Therefore, the inventors have come up with an idea of DC voltage application, connected an electric resistor with the second electrode 3 so as to prevent excess electric current flow and carefully changed the DC voltage and a resistance value. Consequently, it is made clear that operation is made possible at a low voltage as compared with the AC voltage and there is no problem in terms of durability. If operation is possible by the DC voltage, there is also an advantage that the operation is made possible directly by electric power generated by solar cells or electric power from storage batteries.

1-2. Display

Since the light emitting device 10 of the embodiment can emit light with relatively short wavelength, the light can be converted to blue color, green color and red color lights by using proper phosphors. Accordingly, a color display can be produced by using the light emitting device 10. Further, if the light emitting device 10 is used as a light source, it is made relatively easy to make a display flexible, lightweight, and thin.

Various characteristics shown in the embodiments can be combined with one another. In a case where a plurality of characteristics are in one embodiment, at least one of the characteristics can properly be extracted and used alone or in combination for the invention.

1-3. Experiment for Proof 1-3-1. EL Experiment

An EL experiment was carried out by a following method.

First, a silicon substrate was heat oxidized at 1000° C. for 40 minutes in oxygen atmosphere to form a silicon heat oxidized film on a surface thereof.

Next, Ge ions were multiply-implanted in the silicon heat oxidized film in condition of $6.0 \times 10^{15}$ ions/cm$^2$ at 50 keV, $2.0 \times 10^{15}$ ions/cm$^2$ at 20 keV, and $9.0 \times 10^{14}$ ions/cm$^2$ at 10 keV in this order.

Next, the silicon substrate was set in an electric furnace and while evacuating the furnace with a rotary pump, 50 ml/min of nitrogen was led and a heat treatment was carried out at 700° C. for 1 hour. Thereafter, while oxygen diluted to be in 20% concentration was led at 10 ml/min, the heat treatment was carried out for 1 hour in the same manner as described above. The implanted Ge was agglutinated and oxidized with this heat treatment, and germanium oxide in which at least part of the germanium oxide has oxygen deficiency was formed.

Next, an ITO electrode was formed on the silicon heat oxidized film and an aluminum electrode was formed in the silicon substrate side to obtain a light emitting device to be used for the EL experiment.

When an AC voltage (sinusoidal waveform, 50 Vp-p, 1 kHz) was applied between the ITO electrode and the aluminum electrode of this light emitting device, blue emission was observed.

Figure 4:
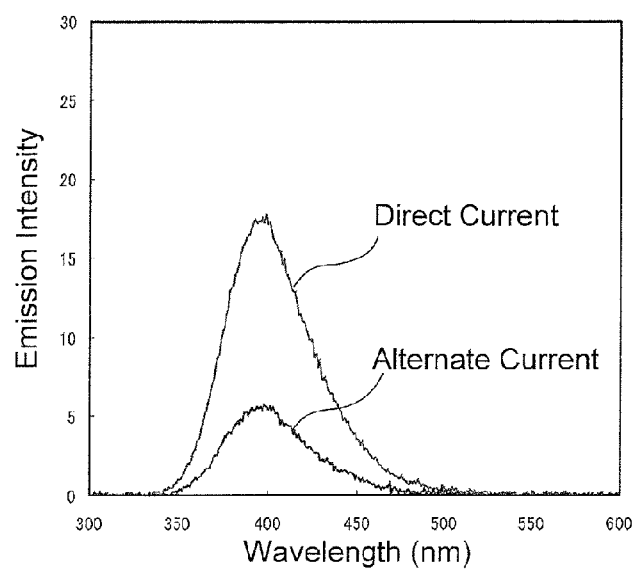
FIG. 4: a graph showing an emission spectrum of a light emitting device of the invention manufactured for an EL measurement experiment.

Further, an emission spectrum of the blue emission is shown in FIG. 4. With reference to FIG. 4, the observed blue emission was found electroluminescent light with a wavelength from 300 nm to 550 nm and having a peak between 350 nm to 500 nm.

Furthermore, when a DC voltage was applied in place of the AC voltage, emission was confirmed at 25V and emission intensity was also found high.

Figure 5:
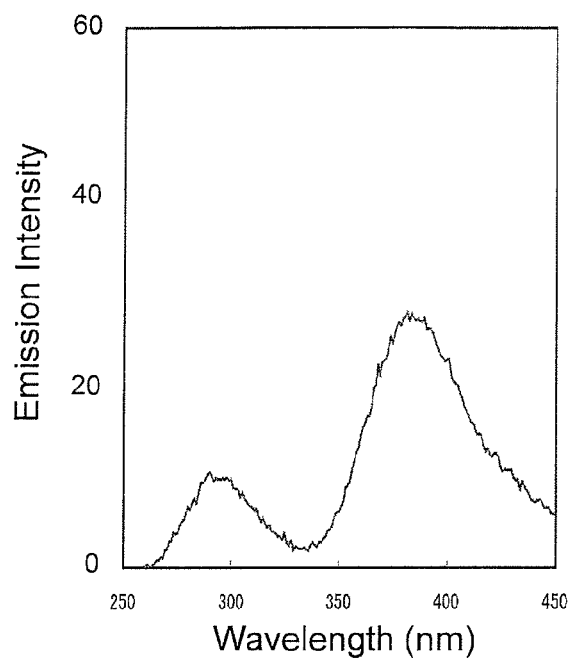
FIG. 5: a graph showing an emission spectrum of a light emitting device of the invention manufactured for an EL measurement experiment.

FIG. 5 shows an emission spectrum in a case where the ITO electrode was made to have a slit structure. In eye observation, intensity was high or approximately same blue emission; however it was also found out to be electroluminescent light of ultraviolet light having a peak in a wavelength of 250 to 350 nm.

One of these two emission lights can be cut by further installing a filter film on the second electrode. For example, it is easy for a filter for the light emitting device of the invention to form a multilayer film.

1-3-2. Relation of Germanium Oxide having Oxygen Deficiency and Emission

It was confirmed that germanium oxide having oxygen deficiency was involved in emission of the light emitting device of the invention by a following method.

First, in the same process as that in the embodiments, a sample was manufactured. In this connection, an atmosphere in an annealing step was changed to be hydrogen. A furnace inside and a pipeline of an annealing furnace were sufficiently vacuum evacuated and subjected to replacement to sufficiently suppress the remaining oxygen.

Besides, an EL experiment was carried out in the same manner to find that emission intensity was weak. It is supposed the following: that is, in annealing in nitrogen, oxidation is carried out by oxygen isolated from SiO$_2$ during Ge implantation or remaining oxygen in supplied nitrogen or in a furnace; however oxygen contributing to oxidation of Ge is little in a case of annealing in hydrogen in this experiment and oxidized Ge is reduced by hydrogen and thus Ge is scarcely oxidized.

Accordingly, it was confirmed that GeO, germanium oxide having oxygen deficiency, was involved in emission of the light emitting device of the invention.

Next, light emitting devices were manufactured in various and different temperature conditions and implantation conditions different from each other and an EL wavelength was measured. The EL wavelength measurement was carried out by reforming a spectrophotofluorometer RF-5300 PC manufactured by Shimadzu Corporation. A method for manufacturing light emitting devices was as described in "1-3-1. EL experiment", except the heat treatment temperature and the Ge implantation amount were properly changed.

Figure 6:
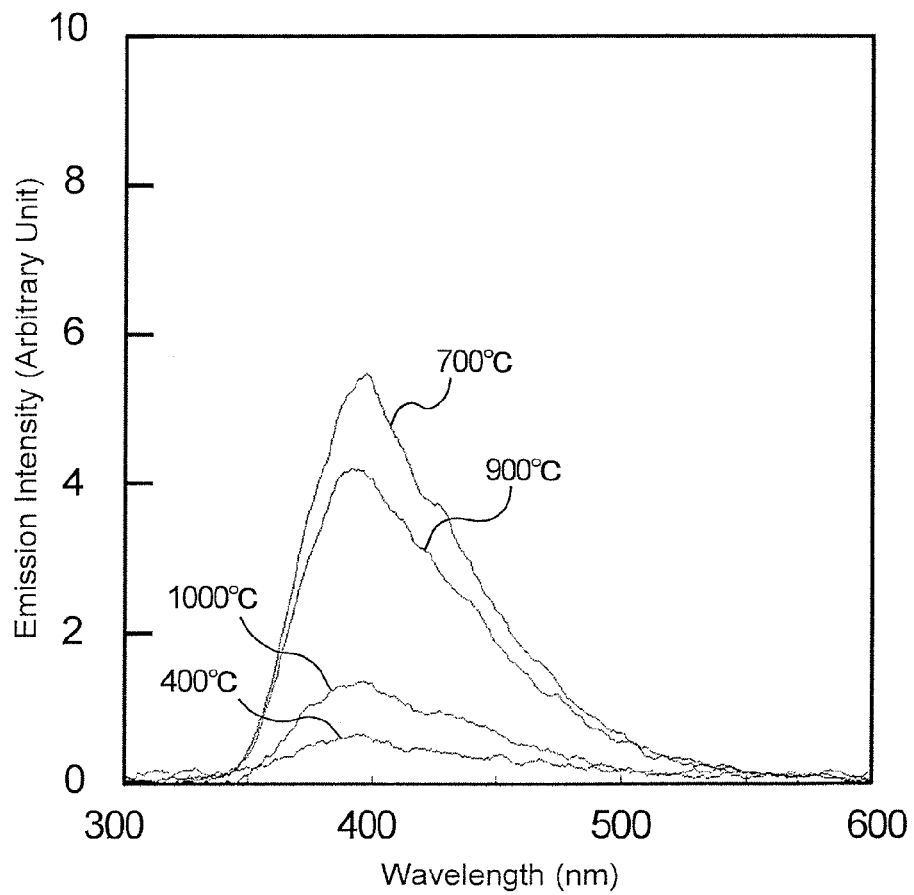
FIG. 6: a graph showing results of EL wavelength measurement for light emitting devices manufactured by carrying out a heat treatment at various temperatures in accordance with the invention.
Figure 7:
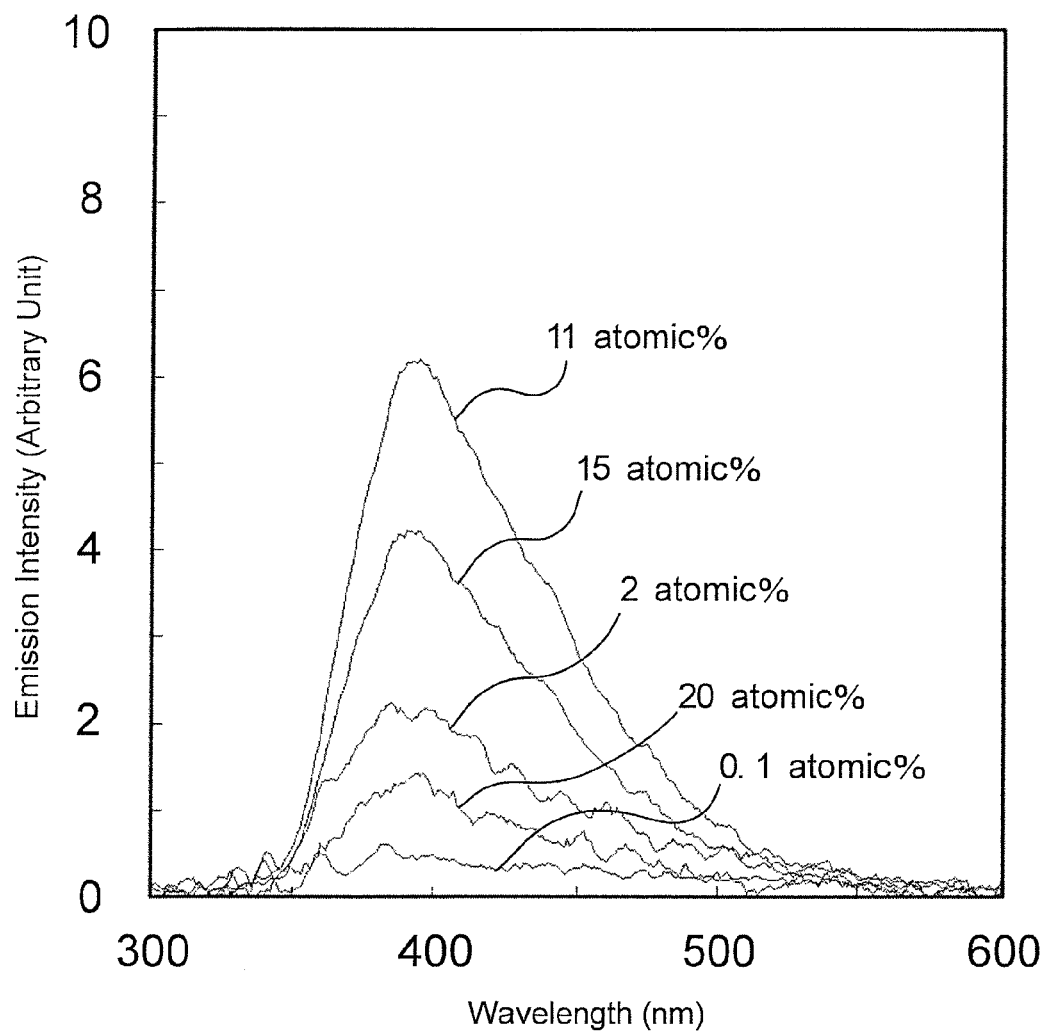
FIG. 7: a graph showing results of EL wavelength measurement for light emitting devices with various Ge concentrations in accordance with the invention.

Obtained results are shown in FIG. 6 and FIG. 7. A temperature in FIG. 6 shows a heat treatment temperature (heating time was 1 hour). "% by atom" in FIG. 7 shows a Ge concentration in a silicon heat oxidized film after Ge implantation. This Ge concentration was measured by Rutherford back scattering method using HRBS 500 manufactured by Kobe Steel, Ltd. Specifically, He ion beam was radiated at 450 keV and recoil particles were analyzed by using a magnetic field type energy analyzer. A depth distribution of germanium atoms in the silicon oxide film can be measured based on scattering from silicon atoms in the silicon oxide film. In this experiment, calculation was made while densities of the silicon oxide film and silicon were assumed to be 2.2 and 2.33 g/cm$^3$, respectively. The Ge concentration in FIG. 6 is 5% by atom and the heat treatment temperature in FIG. 7 is 800° C. (heating time is 1 hour).

With reference to FIG. 6 and FIG. 7, it can be understood that even if the heat treatment temperature and the Ge concentration are changed, a peak wavelength of EL is approximately constant and about 400 nm.

Incidentally, with reference to FIG. 6, it can be understood that the heat treatment temperature is preferably 400 to 1000° C. and more preferably 700 to 900° C. Further, with reference to FIG. 7, it can be understood that the Ge concentration is preferably 0.1 to 20% by atom and more preferably 2 to 11% by atom.

1-3-3. Distribution of Ratios of Ge, GeO, $GeO_2$ in Depth Direction

Light emitting devices were manufactured in accordance with the method described in "1-3-1. EL experiment" and distribution of ratios of Ge, GeO, $GeO_2$ in the depth direction in a silicon heat oxidized film was investigated. A Ge concentration in the light emitting devices manufactured was 5% by atom and a heat treatment temperature was 800° C. (heating time was 1 hour).

Figure 8A:
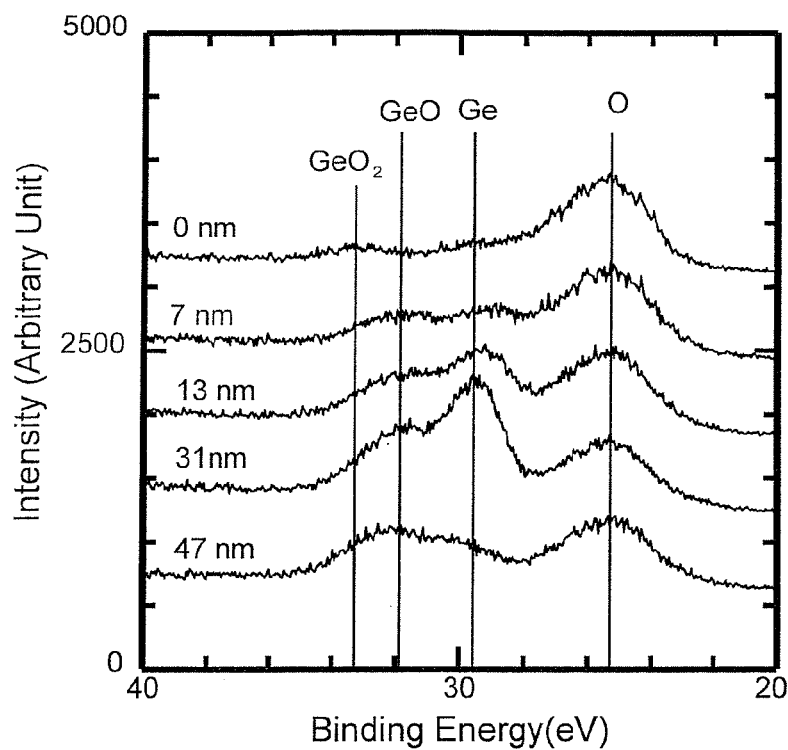
FIG. 8A: an XPS spectrum measured at various depths in accordance with the invention.
Figure 8B:
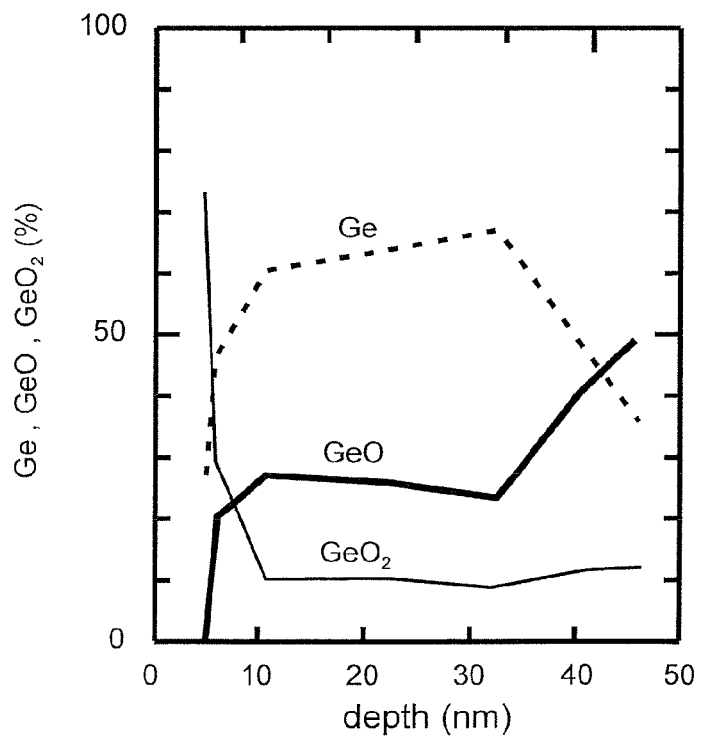
FIG. 8B a graph showing ratios of Ge, GeO and $GeO_2$ at various depths in accordance with the invention.

Since XPS can generally analyze a range from a specimen surface to a depth of several nm, etching by argon ion beam and XPS measurement were carried out alternately to investigate a change of ratios of Ge, GeO, $GeO_2$ in the depth direction in a region to a depth of 50 nm. An energy of the argon ion beam was 4 kV and beam current was 15 mA and radiation was carried out for 300 seconds in each time. FIG. 8A shows a graph of XPS measurement results at that time in relation to respective depths, which are arranged while being shifted in parallel in the vertical direction for easy understanding. FIG. 8B shows a graph of states of Ge atoms contained in the respective depths based on the ratios of Ge (metal Ge), GeO, $GeO_2$.

According to the graphs, in a region of 10 to 50 nm depth where an implantation concentration of Ge implanted by the implantation method described in "1-3-1. EL experiment" is relatively high, a ratio of unoxidized Ge is 30 to 70%. A ratio of $GeO_2$ is between 0 to 20% and about 10%. A ratio of GeO in which Ge is not completely oxidized but partially oxidized is between 10 to 50%.

Figure 9:
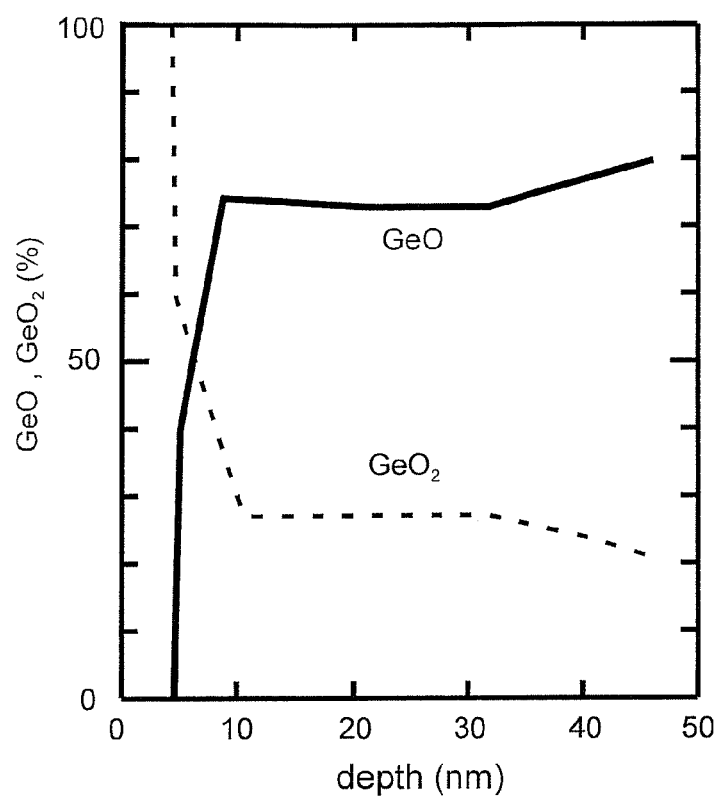
FIG. 9: a graph showing ratios of GeO and $GeO_2$ to an entire germanium oxide ($GeO_2$+GeO) at various depths in accordance with the invention.

The ratios of Ge, GeO, $GeO_2$ in respective depths were determined by measuring surface area $S_{Ge}$ of a peak attributed to Ge, surface area $S_{GeO}$ of a peak attributed to GeO, and surface area $S_{GeO2}$ of a peak attributed to $GeO_2$ in an XPS spectrum near 3d peak of a Ge spectrum and calculating ($S_{Ge}$, $S_{GeO}$, $S_{GeO2}$)/($S_{Ge}$+$S_{GeO}$+$S_{GeO2}$) for the respective depths. Further, ratios of GeO and $GeO_2$ to an entire germanium oxide ($GeO_2$+GeO) are shown in a graph in FIG. 9.

According to the graph, a ratio of completely oxidized $GeO_2$ in germanium oxide is around 20 to 60% except in a surface periphery where a germanium concentration is low and germanium is strongly affected with an atmosphere and easy to be oxidized completely and a ratio of GeO in which Ge is not completely oxidized but partially oxidized is around 40 to 80%. In a region of 10 to 40 nm depth where an implantation concentration of Ge implanted by the implantation method described in "1-3-1. EL experiment" is relatively high, a ratio of $GeO_2$ in which Ge in completely oxidized in germanium oxide is about 50% or lower and about 20 to 30%. A ratio of GeO in which Ge is not completely oxidized but partially oxidized is 50% or higher and about 70 to 80%. The ratios of GeO and $GeO_2$ in respective depths were determined by measuring the surface area $S_{GeO}$ of the peak attributed to GeO and the surface area $S_{GeO2}$ of the peak attributed to $GeO_2$ in the XPS spectrum near 3d peak of the Ge spectrum and calculating the ($S_{GeO}$, $S_{GeO2}$)/($S_{GeO}$+$S_{GeO2}$) for the respective depths. The XPS spectrum was measured using Al K α-ray (1486.6 eV) made monochromatic as an X-ray source.

2. Second Embodiment

A light emitting device of this embodiment additionally includes a substrate; the carrier which is formed on the substrate and has a first parallel face parallel to a substrate surface and second parallel faces lower than the first parallel face in both sides of the first parallel face; a first electrode and a second electrode which are formed on the second parallel faces in both sides of the first parallel face, respectively; further a light emitting region containing the germanium light emitters formed in the carrier between the first electrode and the second electrode; and a translucent protection layer formed on the first electrode, the second electrode, and the first parallel face.

Figure 23:
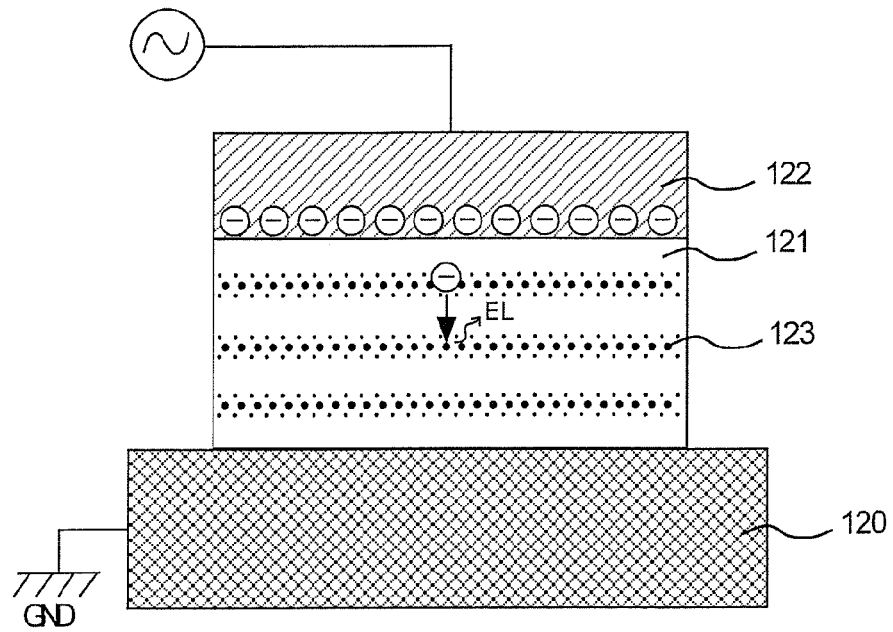
FIG. 23: a schematic cross-sectional view of a conventional EL device in which fine particles are formed in a carrier.
Figure 24:
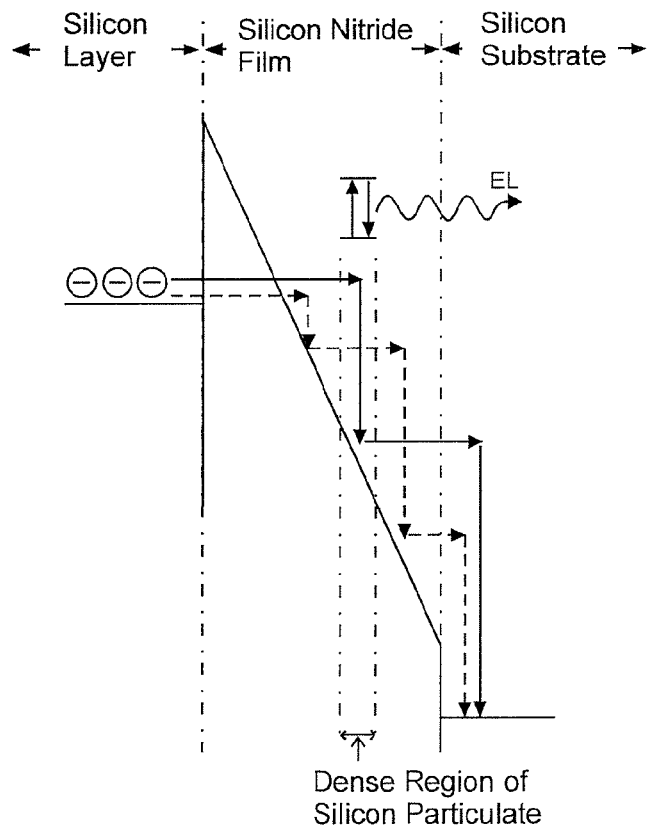
FIG. 24: a schematic band drawing of a conventional EL device in which fine particles are formed in a carrier.

The inventors considered that a reason for low light emitting efficiency of a conventional EL device was because probability of exciting electrons of luminescent centers by electrons supplied from the first electrode or the second electrode which collide against the luminescent centers or pass a vicinity of the luminescent centers is low. It will be explained with reference to an EL device disclosed in Japanese Unexamined Patent Publication No. Hei 11(1999)-310776 as one example. FIG. 23 is a schematic cross-sectional view of a conventional EL device in which fine particles are formed in a carrier. FIG. 24 is a schematic band drawing of a conventional EL device in which fine particles are formed in a carrier. With respect to the EL device disclosed in Japanese Unexamined Patent Publication No. Hei 11(1999)-310776, since a polycrystalline silicon nitride film and a polycrystalline silicon film are alternately layered and thereafter a heat treatment is carried out to form fine particles, it is supposed that a region where a density of the fine particles is high and a region where the density of the fine particles is low are alternately layered. In this device, electrons implanted to a conduction band of a silicon nitride film 121 from a silicon layer 122 are accelerated by an electric field in a direction perpendicular to a region where a density of silicon fine particles 123 is high. Since the region where the density of the silicon fine particles 123 is high and the electron acceleration direction are crossed at right angles, probability of existence of the silicon fine particles 123, which are luminescent centers, in a place where electrons are accelerated by the electric field and provided with kinetic energy sufficient to excite the electrons of the silicon fine particles 123 becomes low. That is, probability of collision of electrons with the silicon fine particles 123 as the luminescent centers is lowered, the electrons being capable of allowing the silicon fine particles 123 to emit light and thus probability of emission of the silicon fine particles 123 is supposed to be low.

Further, since the respective electrons supplied to the silicon nitride film 121 may sometimes lose kinetic energy due to scattering of phonons or the like in the silicon nitride film 121, it is supposed that probability of electrons which reach the silicon fine particles 123 arranged at right angles to the electron acceleration direction and have kinetic energy sufficient for making the luminescent centers to emit light is low. For example, as shown with a dotted line arrow in FIG. 24, in a case where the electrons supplied to the conduction band of the silicon nitride film 121 lose the kinetic energy due to scattering of phonons or the like before arriving at the luminescent centers, it is supposed that even if the electrons accelerated in the electric field have high energy, the electrons do not contribute to emission unless the electrons have sufficient energy to excite the luminescent centers at the point of collision with the luminescent centers. That is, the number of times of collision of electrons having sufficient kinetic energy with the luminescent centers is low in a case of the conventional EL device and thus light emitting efficiency is limited.

Figure 10A:
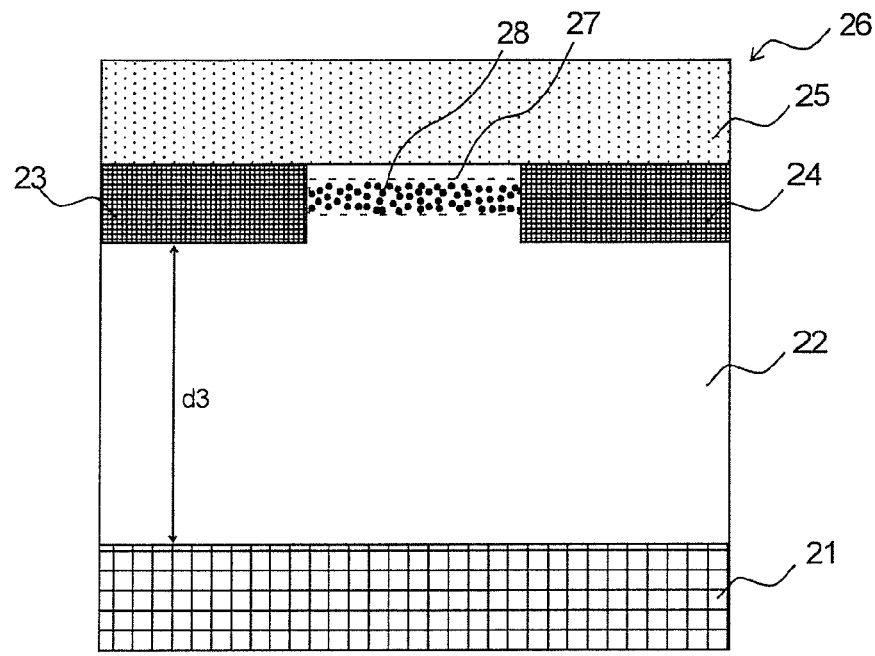
FIG. 10A: a schematic cross-sectional view of a light emitting device of an embodiment of the invention.
Figure 10B:
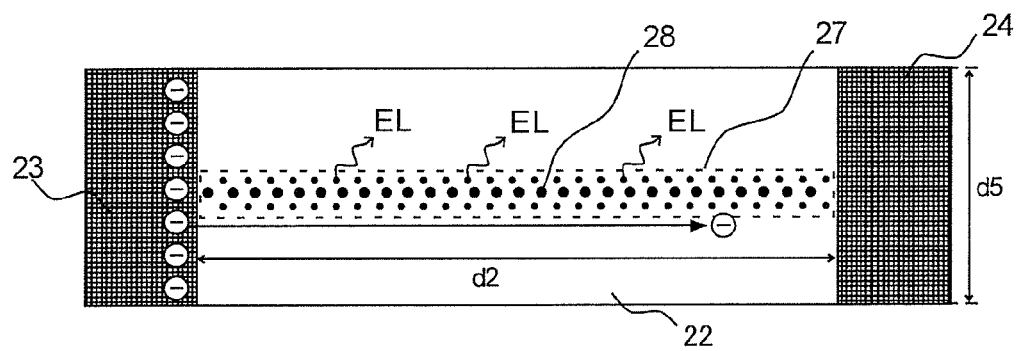
FIG. 10B and FIG. 10C: schematic cross-sectional views of a carrier between a first electrode and a second electrode of a light emitting device of an embodiment of the invention.
Figure 10C:
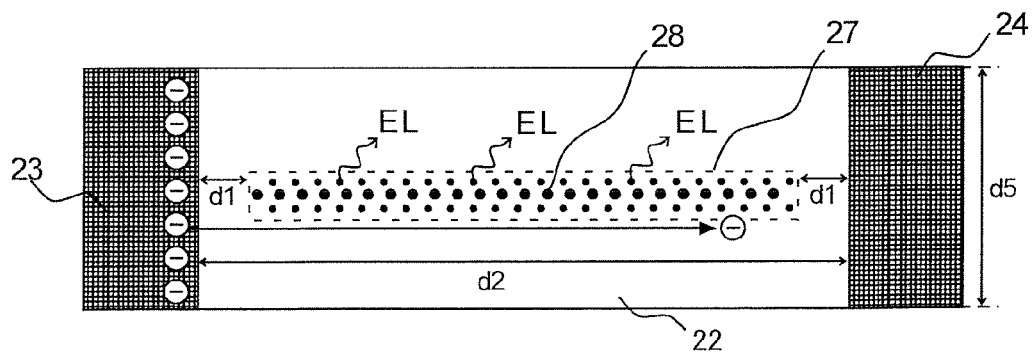

The light emitting device of this embodiment has a structure suitable for heightening light emitting efficiency. It will be explained with reference to drawings. FIG. 10A is a schematic cross-sectional view of the light emitting device of one embodiment of the invention: FIGS. 10B and 10C are schematic cross-sectional views of a carrier between a first electrode and a second electrode of the light emitting device of one embodiment of the invention. In FIG. 10C, intervals are provided between a light emitting region 27 and both of a first electrode 23 and a second electrode 24. As shown in FIGS. 10B and 10C, a direction of an electric field applied to the first electrode 23 and the second electrode 24, that is, a direction in which the electrons supplied from the first electrode 23 or the second electrode 24 are accelerated, is made parallel to the light emitting region 27, which is a region where germanium light emitters 28 are distributed. According to the above description, probability of existence of the germanium light emitters 28 can be heightened in a place where the electrons which are accelerated by the electric field and provided with kinetic energy for exciting the electrons of the luminescent centers exist. That is, probability of mutual reaction of the electrons implanted from the first electrode 23 or the second electrode 24 and accelerated by the electric field in s state where the electrons have kinetic energy to excite the electrons of the germanium light emitters 28, as the luminescent centers, with the germanium light emitters 28. As a result, light emitting efficiency of a light emitting device 26 can be increased. Further, electrons mutually reacted once with the germanium light emitters 28 can be mutually reacted with the germanium light emitters 28 after accelerated again by the electric field and provided with sufficient kinetic energy and therefore, light emitting efficiency of the light emitting device 26 can be increased.

Hereinafter, an embodiment of the invention will be described with reference to drawings. The drawings and configuration described as follows are illustrative and it is not intended that a scope of the invention be limited to the drawings and descriptions as follows.

2-1. Structure of Light Emitting Device

A light emitting device 26 of this embodiment includes a substrate 21, a carrier 22 formed on the substrate 21 and having a first parallel face and second parallel faces lower than the firsts parallel face in both sides of the first parallel face, a first electrode 23 and a second electrode 24 formed respectively on the second parallel faces in both sides of the first parallel face) and a light emitting region 27 formed in a portion of the carrier 22 between the first electrode 23 and the second electrode 24, wherein the light emitting region 27 is a region in which germanium light emitters 28 distributed in parallel to the first parallel face is formed.

Figure 11:
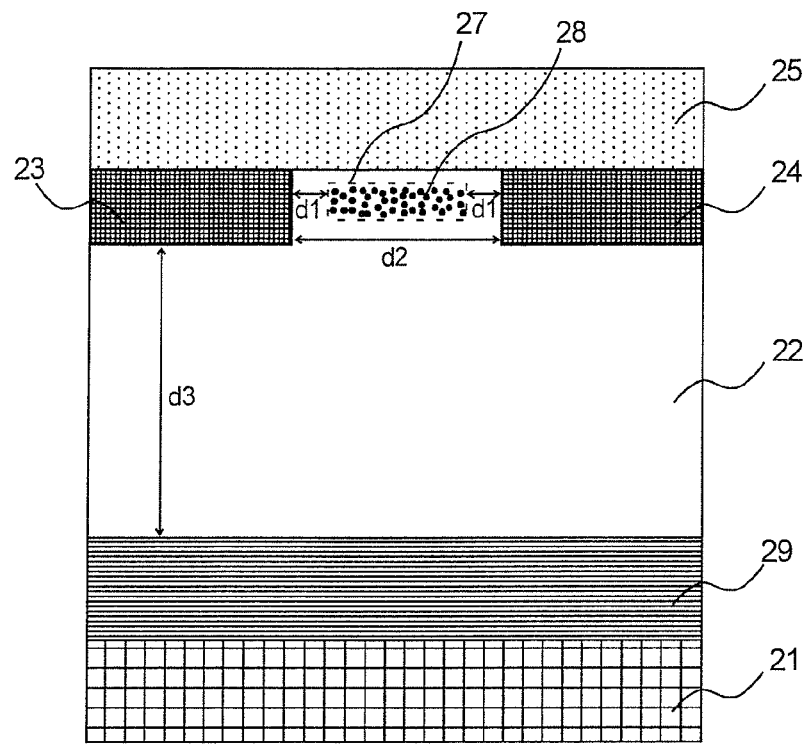
FIG. 11: a schematic cross-sectional view of a light emitting device of an embodiment of the invention in which a reflection layer is formed.

Further, the light emitting device 26 of this embodiment may have a reflective layer between the substrate 21 and the carrier 22. In this connection, FIG. 11 is a schematic cross-sectional view of a light emitting device having a reflective layer 29 of one embodiment of the invention.

Hereinafter, each constituent element of the light emitting device of one embodiment of the invention will be described.

2-1-1. Substrate

The substrate 21 is not particularly limited; however it is, for example, a silicon substrate. Use of a silicon substrate as the substrate 21 makes it possible to be silicon oxide capable of forming the carrier 22 described later on a surface of the silicon substrate.

Use of a silicon substrate as the substrate 21 makes it possible to install an LSI and the light emitting device of the invention in combination on the silicon substrate.

2-1-2. Carrier

The carrier 22 is not particularly limited if it is formed on the substrate 21 and has the first parallel face and the second parallel faces lower than the first parallel face in both sides of the first parallel face and is an insulator having light transmittance or a semiconductor with high resistance. In addition, the light transmittance in this invention means capability of transmitting light emitted by a light emitting device.

The first parallel face is a face in a portion of an upper face of the carrier 22. Further, the second parallel faces are faces in portions of an upper face of the carrier 22 and lower than the first parallel face. Further, the carrier 22 may have a step between the first parallel face and the second parallel faces.

Further, the first parallel face may be made linear with a constant width and the second parallel faces may be made liner with a constant width in both sides of the linear first parallel face. A plurality of the first parallel faces and the second parallel faces may be formed on a single substrate.

A material of the carrier 22 is not particularly limited if it is an insulator having light transmittance or a semiconductor with high resistance and suitable for forming the light emitting region 27 and it is, for example, silicon oxide, or silicon nitride, or silicon oxynitride. Further, the carrier 22 may be formed in a layered structure. In a case where the carrier 22 is made to have a layered structure, a lower layer may be used as a reflective layer 29 described below. The carrier 22 may be also required to have an electric insulating property. An insulating layer made of silicon oxide to be used generally in CMOS technique is supposed to be excellent in an insulating property and have a withstand voltage of about 10 MV/cm and sufficient capabilities.

Further, for example, the carrier 22 may have a transmittance of light with a wavelength of 250 nm or longer and 500 nm or shorter in a range of 50% or higher and 99.99% or lower. Since the transmittance of light with 250 nm to 500 nm is high, it is made possible to use the light directly for a display and emit light with different wavelength by mounting a color conversion device or a color filter on the light emitting device 26. Further, in a case where germanium light emitters 28 described below are fine particles containing GeO and $GeO_2$, since the fine particles show an EL emission with a wavelength of about 390 nm, the EL emission can efficiently be utilized.

A shape of the carrier 22 is not particularly limited if it has the first parallel face and the second parallel faces lower than the first parallel face in both sides of the first parallel face; however a thickness d3 of the carrier 22 under the second parallel faces may be thicker than a length d2 of the carrier 22 between the first electrode 23 and the second electrode 24. Electric current flow between the substrate 1 and the first electrode 23 or the second electrode 24 is prevented and short circuit can be avoided at a time of voltage application by making the d3 higher than the d2.

The thickness d3 of the carrier 22 under the second parallel faces may be, for example, 80 to 150 nm (e.g. in a range between whichever two numerals of 80, 90, 100, 110, 120, 130, 140, and 150 nm).

Further, a thickness of the carrier 22 under the first parallel face is, for example, thicker than the thickness d3 and between 100 to 200 nm (e.g. in a range between whichever two numerals of 100, 110, 120, 130, 140, 150, 160, 170, 180, 190, and 200 nm).

The length d2 between the first electrode 23 and the second electrode 24 is, for example, a length shorter than the d3 and in a range of 40 to 100 nm (e.g. in a range between whichever two numerals of 40, 50, 60, 70, 80, 90, and 100 nm). A driving voltage for making a light emitting device emit light can sufficiently be lowered by adjusting the d2 to 40 to 100 nm. Particularly, an adjustment of the d2 to 40 to 60 nm makes it possible to give a driving AC voltage of 30 to 40 V and use the light emitting device for domestic electronic products or the like. Further, processing of width of the line with 40 to 60 nm is equal to a gate length of an LSI to be formed on a silicon substrate presently or in the future and thus it is made possible to mount the light emitting device and the LSI in combination on a single silicon substrate. Further, the line width processing can be carried out by using excimer laser of ArF or the like.

Further, in a case where the d2 is longer than 100 nm, it may result in increase of a threshold voltage needed for EL emission.

2-1-3. Light Emitting Region

The light emitting region 27 is not particularly limited if it is formed in a portion of the carrier 22 between the first electrode 23 and the second electrode 24 and it is a region where a plurality of the germanium light emitters 28 distributed in the carrier 22 in parallel to the first parallel face are formed.

Further, the light emitting region 27 may have a region where a density of the germanium light emitters 28 parallel to the first parallel face is relatively high. Electrons are accelerated by an electric field in a region with a relatively high density of the germanium light emitters 28 in parallel to the region, so that probability of collision of electrons having energy for exciting the electrons of the germanium light emitters 28, which are luminescent centers, with the germanium light emitters 28 can be heightened. That is, light emitting efficiency of the light emitting device can be heightened.

In this connection, if there is a region with remarkably different densities of the germanium light emitters 28 in the carrier 22, the light emitting region 27 is a region where the density of the germanium light emitters 28 is high.

A shape of the light emitting region 27 is not particularly limited if it is parallel to the first parallel face.

Further, the light emitting region 27 may have a region with a high density of the germanium light emitters 28, for example, in one sixth to five sixth in the first electrode 23 and the second electrode 24 in the film thickness direction (e.g. in a range between whichever two numerals of one sixth, two sixth, three sixth, four sixth, and five sixth). A plurality of regions with a high density of the germanium light emitters 28 may be formed.

A thickness of the light emitting region 27 is thinner than, for example, a length between the first parallel face and the second parallel faces and 5 to 60 nm (e.g. in a range between whichever two numerals of 5, 10, 20, 30, 40, 50, and 60 nm).

Further, a length in a direction between the first electrode 23 and the second electrode 24 in the light emitting region 27 is a length shorter than, for example, the 2d and 20 to 80 nm (e.g. in a range between whichever two numerals of 20, 30, 40, 50, 60, 70, and 80 nm).

Further, a length d1 from the light emitting region 27 to the first electrode 23 and the second electrode 24 may be, for example, 5 to 15 nm (e.g. in a range between whichever two numerals of 5, 6, 7, 8, 9, 10, 11, 12, 13, 14, and 15 nm).

An adjustment of the d1 to 5 to 15 nm makes it possible to heighten light emitting efficiency. A reason for this will be described below. It is supposed that if electrons implanted from the first electrode 23 or the second electrode 24 are accelerated by the electric field and provided with kinetic energy sufficient to excite the electrons of the germanium light emitters 28, which are luminescent centers before the electrons are mutually reacted with the germanium light emitters 28, no emission is generated and the kinetic energy of the electrons is lost for phonons or the like and converted into heat. Accordingly, it is required that the electrons are provided with sufficient kinetic energy before they reach the germanium light emitters 28. Accordingly, for example, assuming that the electrons are accelerated in the electric field of about 3 MV/cm to 7 MV/cm and excitation energy for making the germanium light emitters 28 emit light is 5 to 10 eV, in order to obtain energy necessary for electrons to make the germanium light emitters 28 emit light, the electrons have to be accelerated in 5 nm to 15 nm without scattering and obtain the kinetic energy. With this configuration, it is made possible to increase probability of mutual reaction of the electrons supplied from the electrode with the germanium light emitters 28, which are luminescent centers, while the electrons have energy necessary to excite the electrons of the germanium light emitters 28 and thus the light emitting efficiency can be heightened. In addition, the electric field of about 3 MV/cm to 7 MV/cm is an electric field having lower withstand voltage than a silicon oxide film and possible to be applied stably.

Further, with respect to a EL device having a structure in which a light emitting region is sandwiched between transparent electrodes from an upper and lower sides and the acceleration direction of electrons is in parallel to the extraction direction of EL emission, since transmittance of the transparent electrodes is not 100%, light emitting efficiency is lowered, whereas the acceleration direction of the electrons and the extraction direction of the emission are perpendicular in this embodiment and a decrease of emission intensity due to the transparent electrodes is not caused and therefore, the emission can efficiently be extracted.

2-1-4. Germanium Light Emitters

The germanium light emitters 28 are not particularly limited if a plurality of them are formed in the light emitting region 27.

Further, the germanium light emitters 28 are, for example, germanium fine particles. The germanium light emitters 28 may also be fine particles containing, for example, germanium oxide GeO having oxygen deficiency and $GeO_2$. It is made possible to provide an EL device showing EL emission with a peak wavelength between a wavelength of 250 nm to 500 nm by making the germanium light emitters 28 particularly be fine particles containing GeO. Light with such a short wavelength can be used directly for a display and for emission use with different wavelengths by mounting a color conversion device or a color filter on a light emitting device.

2-1-5. First Electrode and Second Electrode

The first electrode 23 and the second electrode 24 are not particularly limited if they are electrodes formed respectively on the second parallel faces in both sides of the first parallel face of the carrier 22.

Further, materials of the first electrode 23 and the second electrode 24 are not particularly limited if they are electrode materials and for example, they are cobalt silicide, titanium silicide, nickel silicide or polysilicon doped with arsenic, phosphorus, boron, or the like. Particularly, a sheet resistance can be lowered by using cobalt silicide, titanium silicide or nickel silicide for the materials of the first electrode 23 and the second electrode 24. A voltage threshold value needed for emission can be lowered by lowering the sheet resistance of the electrodes or the like.

Further, lower faces of the first electrode 23 and the second electrode 24 have contact with the second parallel faces and the side faces have contact with the carrier 22 under the first parallel face. Thicknesses of the first electrode 23 and the second electrode 24 may be adjusted to 80 to 100% of a length between the first parallel face and the second parallel faces. The thicknesses are preferably 90 to 99%. If the thicknesses exceed 100%, a structure in which the first electrode 23 and the second electrode 24 partially leak over the first parallel face of the carrier 22 is formed and a distance between the first electrode 23 and the second electrode 24 is narrowed and therefore, an insulation breakdown voltage is lowered. On the other hand, if the thicknesses are lower than 80%, the sheet resistance is increased and a power of an outside electric power source necessary to apply a light emitting voltage becomes high.

2-1-6. Protection Layer

A protection layer 25 is not particularly limited if it is formed on the first electrode 23, the second electrode 24, and the first parallel face and has a translucent property.

Further, a material of the protection layer 25 is, for example, silicon oxide, silicon nitride, or silicon oxynitride.

A thickness of the protection layer 25 is, for example, 50 to 500 nm (e.g. in a range between whichever two numerals of 50, 100, 150, 200, 250, 300, 400, and 500 nm).

Further, a light transmittance of the protection layer 25 in a wavelength of 250 nm or longer and 330 nm or shorter, or a wavelength of 350 nm or longer and 500 nm or shorter, or both ranges is, for example, 60% or higher and 99.99% or lower (e.g. in a range between whichever two numerals of 60, 65, 70, 75, 80, 85, 90, 95, 99, and 99.99%). Since the transmittance of light with this wavelength range is high, it is made possible to use the light directly for a display or emit light with different wavelengths by mounting a color conversion device or a color filter on the light emitting device 26. Further, in a case where the germanium light emitters 28 are fine particles containing GeO and $GeO_2$, since the fine particles show EL emission with a wavelength in this range, this EL emission can efficiently be utilized.

Further, formation of the protection layer 25 can prevent deterioration of the light emitting region 27 or the like with oxygen, water, or the like in an atmosphere.

2-1-7. Reflective Layer

A reflective layer 29 may be formed between the substrate 21 and the carrier 22.

A material of the reflective layer 29 is, for example, a layered film of a metal such as aluminum or an insulator of a material different from the material of the carrier. Formation of the reflective layer 29 makes it possible to reflect light emitted by EL emission in the light emitting region 27 and coming in the substrate 21 direction upward and extract the light more efficiently.

Since the reflective layer 29 is formed using an insulator, it provides an advantage that a distance from the substrate 21 to the first electrode 23 and the second electrode 24 can be widened and electric short circuit is hardly caused. Further, it is made possible to efficiently reflect light with a desired wavelength fitted to a wavelength of a light emitted in the light emitting region 27 by arbitrarily changing a material and a thickness of the reflective layer 29, which is a layered film of an insulator.

Further, in a case where the reflective layer 29 is formed using a metal, since electric short circuit may be caused easily, the reflective layer 29 has to be sufficiently thicker than a length between the first electrode 23 and the second electrode 24.

2-2. Method for Using the Light Emitting Device

The light emitting device of this embodiment emits EL emission by applying a voltage between the first electrode 23 and the second electrode 24. Particularly, emission intensity can be increased by applying an AC voltage rather than a DC voltage. For example, a sinusoidal AC voltage of 1 Hz to 10 kHz which can form an electric field of 3 MV/cm to 10 MV/cm between the first electrode 23 and the second electrode 24 may be applied.

Accordingly, electrons supplied from the first electrode 23 or the second electrode 24 to the carrier 22 can be accelerated by an electric field and excite an energy level of the germanium light emitters 28, the luminescent centers, to accomplish EL emission.

2-3. Method for Manufacturing the Light Emitting Device

A method for manufacturing the light emitting device 26 of this embodiment involves a second parallel face formation step of forming a first parallel face and second parallel faces lower than the first parallel face in both sides of the first parallel face by etching a portion of the translucent carrier 22 formed on the substrate 21; a polysilicon layer formation step of forming a polysilicon layer on the first parallel face and the second parallel faces; an etching step of removing the polysilicon layer on the first parallel face by etching; a light emitting region formation step of forming the germanium light emitters 28 distributed in parallel to the first parallel face by ion implanting an inorganic substance into the carrier 22 under the first parallel face and thereafter carrying out a heat treatment; an electrode formation step of forming the first electrode 23 and the second electrode 24 on the second parallel faces in both sides of the first parallel face by forming a high melting point metal layer on the polysilicon layer and thereafter carrying out a heat treatment; and a protection layer formation step of forming the protection layer 25 on the first electrode 23 and the second electrode 24.

Further, in the method for manufacturing the light emitting device 26 of this embodiment, a carrier formation step may also be included before the second parallel face formation step. In the method for manufacturing the light emitting device 26 of this embodiment, a reflective layer formation step may also be included before the carrier formation step.

Hereinafter, each step of the method for manufacturing the light emitting device 26 of this embodiment will be described.

2-3-1. Second Parallel Face Formation Step

Figure 12:
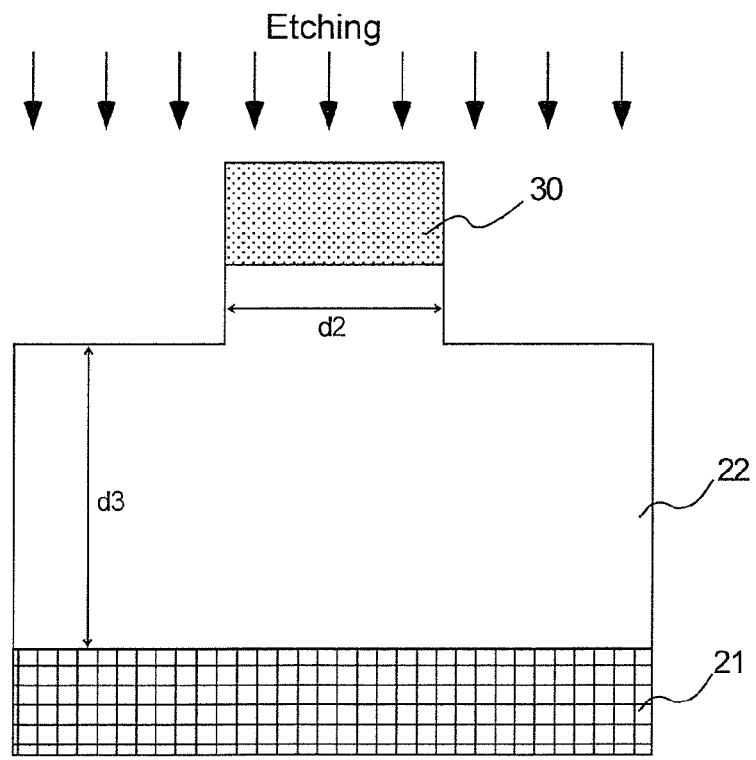
FIG. 12: a schematic cross-sectional view of a light emitting device of an embodiment of the invention in a step of forming the second parallel face formation step.

FIG. 12 is a schematic cross-sectional view in the second parallel face formation step of the light emitting device 26 of one embodiment of the invention.

A portion of the carrier 22 having a translucent property and formed on an upper part of the substrate 21 is etched to form the second parallel faces lower than the first parallel face in both sides of the first parallel face on the carrier 22. For example, as the carrier 22, a silicon oxide film formed on a surface of a silicon substrate can be used. Further, as shown in FIG. 12, etching is carried out by, for example, forming a photoresist 30 with a line width of, for example, 40 to 100 nm on a surface of the carrier 22 and then carrying out etching to form the second parallel faces lower than the first parallel face on the carrier 22 where no photoresist 30 is formed. Thereafter, the photoresist 30 is removed to form the second parallel faces on the carrier 22. The line width of the photoresist 30 becomes substantially the same as d2 and the line width is about the same as a gate length of a latest silicon transistor and is can be formed by using excimer laser of ArF or the like used in its generation.

2-3-2. Polysilicon Layer Formation Step

After the second parallel faces are formed on the carrier 22, a polysilicon layer 31 is formed on the first parallel face and the second parallel faces. For example, the polysilicon layer 31 can be formed on the carrier 22 by sputtering.

2-3-3. Etching Step

Figure 13:
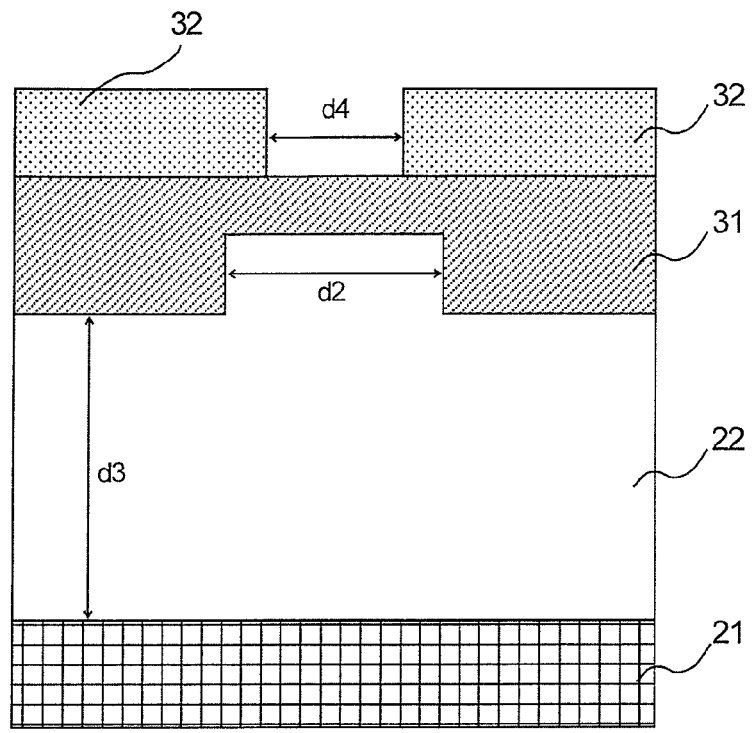
FIG. 13: a schematic cross-sectional view of a light emitting device of an embodiment of the invention in an etching step.
Figure 14:
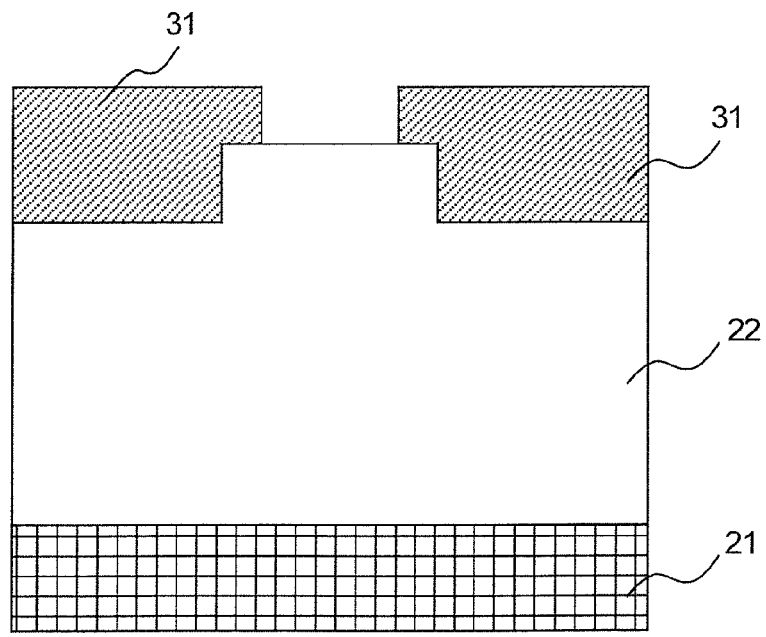
FIG. 14: a schematic cross-sectional view of a light emitting device of an embodiment of the invention in an etching step.

FIG. 13 and FIG. 14 are schematic cross-sectional views in the etching step of the light emitting device 26 of one embodiment of the invention.

The polysilicon layer 31 on the first parallel face is removed by etching. The polysilicon layer 31 to be removed by etching may be the polysilicon layer 31 on a portion of the first parallel face. For example, a photoresist 32 may be formed such that an aperture is formed in an upper part of the first parallel face of the carrier 22 on an upper face of the polysilicon layer 31 as shown in FIG. 13. Thereafter, the polysilicon layer 31 on which the photoresist 32 is not formed can be removed by etching. After that, the photoresist 32 is removed to form the polysilicon layer 31 on a portion of the second parallel faces and the first parallel face of the carrier 22 as shown in FIG. 14.

In addition, a width d4 of the aperture part of the photoresist 32 and a position in the direction between the first electrode 23 and the second electrode 24 may be substantially the same as a width (d2−2×d1) of the light emitting region 27 and a position in the direction between the electrodes in some cases, and therefore, the photoresist 32 may be formed to obtain the desired light emitting region 27.

Further, the width d4 of the aperture part of the photoresist 32 can be wider than a width of the desired light emitting region 27. In this case, the desired light emitting region 27 can be formed based on, for example, a difference of diffusion coefficient of germanium in silicon oxide and in silicon (described later).

In this connection, etching of the polysilicon layer 31 may be carried out by employing RIE; however if a gas with low selectivity of the polysilicon layer 31 and the carrier 22 is employed, the carrier 22 is etched or considerably significant damages are possibly caused and therefore, the polysilicon layer 31 to be removed by etching may be left in about several nm and anisotropic etching by RIE may be carried out and thereafter oxidation is carried out in oxygen atmosphere to form a silicon oxide film and then wet etching may be carried out with hydrofluoric acid (HF).

2-3-4. Light Emitting Region Formation

Figure 15:
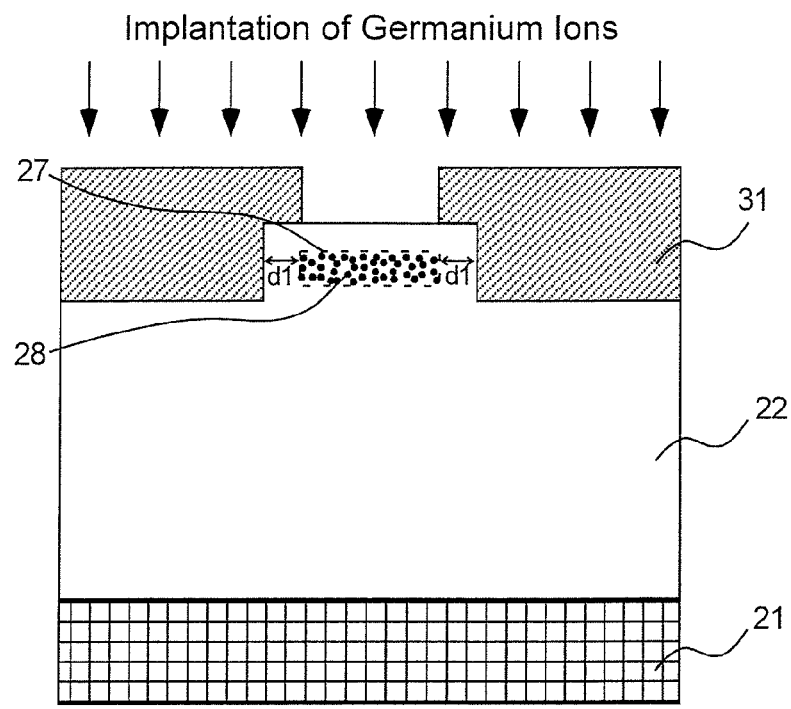
FIG. 15: a schematic cross-sectional view of a light emitting device of an embodiment of the invention in a light emitting region formation step.

FIG. 15 is a schematic cross-sectional view in the light emitting region formation step of the light emitting device of one embodiment of the invention.

After the polysilicon layer 31 having the aperture is formed, germanium to be the germanium light emitters is ion-implanted into the carrier 22 under the first parallel face and thereafter a heat treatment is carried out to form the germanium light emitters 28 distributed in parallel to the first parallel face. For example, germanium ions are ion-implanted from a position above the first parallel face of the carrier 22 and then a heat treatment is carried out to form the light emitting region 27 in which a plurality of germanium fine particles or fine particles containing germanium oxide GeO having oxygen deficiency and $GeO_2$ are formed in the carrier 22 under the first parallel face. At a time of ion implantation, since the polysilicon layer 31 is formed on the carrier 22 under the second parallel faces and an end part of the first parallel face, no ion is implanted. Accordingly, the ion implantation can be carried out in the carrier 22 at a lower part of the aperture of the polysilicon layer 31.

In addition, the ion implantation method makes it possible to control a germanium ion concentration and distribution state in the light emitting region 27 with a very high precision and reproducibility by a method employed in a doping step of a CMOS circuit using a silicon substrate and very fine devices arranged therein. According to the above description, in a case where a plurality of light emitting devices are formed on a single substrate, variation of the germanium concentration (density of fine particles) can be narrowed. Accordingly, variation of emission of a plurality of the light emitting devices can be narrowed.

Further, EL emission intensity can be increased by carrying out a heat treatment after ion implantation. The heat treatment can be carried out by, for example, annealing at 1000° C. for 30 seconds. The germanium ions are, for example, agglomerated and form into dot-like forms by the heat treatment and it is made clear that their diameter is 10 nm or smaller from a TEM image (not illustrated). That is, since they are not dots with about 10 μm as observed in a conventional dispersion type EL device, it is made relatively easy to obtain fine devices and high quality images.

Further, in a case where the germanium ions are implanted into, for example, the silicon oxide layer, which is the carrier 22 under the first parallel face in a range wider than a width of the desired light emitting region 27, the light emitting region 27 can be provided with a desired width by utilizing a difference of a diffusion coefficient of germanium. That is, since the diffusion coefficient of germanium is higher in the polysilicon layer 31 than that in the silicon oxide layer, the germanium ions implanted to an end part of the carrier 22 under the first parallel face are diffused quickly in the polysilicon layer 31 by annealing treatment. On the other hand, the germanium ions implanted in a region relatively far from the polysilicon layer 31 are not changed in a total number and in a contribution to the emission although a distribution in the silicon oxide layer is slightly changed due to diffusion. In such a manner of utilizing the difference of the diffusion coefficient of germanium, not only the light emitting region 27 with a desired size can be formed but also the germanium concentration in the carrier 22 in both sides of the light emitting region 27 can sufficiently be lowered and accordingly electrons supplied from the electrodes are provided with kinetic energy sufficient to arrive at the light emitting region 27.

2-3-5. Electrode Formation Step

After the light emitting region 27 is formed, a high melting point metal layer is formed on the polysilicon layer 31 and then a heat treatment is carried out to form the first electrode 23 and the second electrode 24 respectively on the second parallel faces in both sides of the first parallel face. For example, after the polysilicon layer 31 existing in a part of the carrier 22 higher than the first parallel face is removed by etching, a high melting point metal layer of cobalt, titanium, nickel or the like is deposited on the polysilicon layer 31 on the second parallel faces by sputtering or the like. Thereafter, annealing treatment is carried out at, for example, about 600° C. to cause a reaction of the polysilicon layer 31 and the high melting point metal layer and form a silicified high melting point metal on the second parallel faces and thus the first electrode 23 and the second electrode 24 can be formed. Further, a non-reacted high melting point metal layer can be removed by immersing the substrate in sulfuric acid-hydrogen peroxide mixture (sulfuric acid-hydrogen peroxide water), hydrochloric acid-hydrogen peroxide mixture (hydrochloric acid-hydrogen peroxide water), ammonium hydrogen peroxide mixture, or the like.

Further, generally, since the silicon oxide layer, which is the carrier 22, is generally not reacted with cobalt, titanium, nickel or the like by annealing treatment for silicidation, the silicified high melting point metal can be formed only in a region where the polysilicon layer 31 is formed.

Further, in order to carry out etching of the polysilicon layer 31 existing in the carrier 22 in a part higher than the first parallel face, RIE may be employed; however the carrier 22 under the first parallel face is etched or considerably significant damages may possibly be caused. Therefore, the polysilicon layer 31 formed on the second parallel faces may be left in about several nm and anisotropic etching by RIE may be carried out and thereafter, for example, oxidation is carried out in oxygen atmosphere to form a silicon oxide film and then wet etching may be carried out with hydrofluoric acid (HF). At that time, the carrier 22 under the first parallel face may be prevented from etching by wet etching.

Further, in the reaction of the polysilicon layer 31 and the high melting point metal layer, it is desired to fully silicify the polysilicon layer 31 without leaving any portion. It can be produced by adjusting a thickness of the high melting point metal layer to be deposited and is a needed technique for lowering outside resistance besides EL devices.

Figure 16:
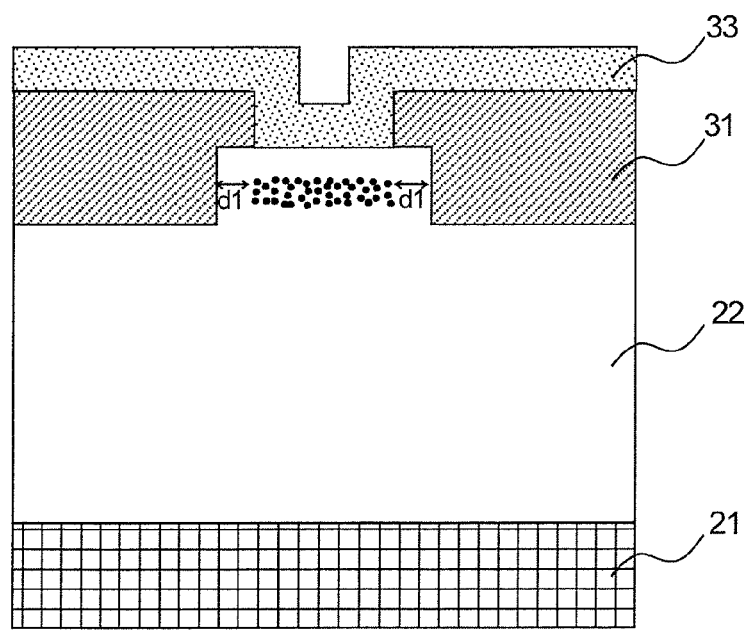
FIG. 16: a schematic cross-sectional view of a light emitting device of an embodiment of the invention in an electrode formation step.

Further, FIG. 16 is a schematic cross-sectional view in the electrode formation step of the light emitting device 26 of one embodiment of the invention.

For example, after a high melting point metal layer 33 of cobalt, titanium, nickel or the like is deposited on an upper part of the polysilicon layer 31 on the second parallel faces by sputtering or the like, annealing treatment is carried out at 600° C. to cause a reaction of the polysilicon layer 31 and the high melting point metal layer 33 to form a silicified high melting point metal on the second parallel faces. Thereafter, the high melting point metal silicide existing in a part of the carrier 22 higher than the first parallel face is removed by CMP or the like to form the first electrode 23 and the second electrode 24.

In this case, after the annealing treatment, the high melting point metal layer 33 unreacted with the polysilicon layer 31 is removed and then the high melting point metal silicide and the first parallel face can be flattened by CMP or the like.

2-3-6. Protection Layer Formation Step

After formation of the first electrode 23 and the second electrode 24, the protection layer 25 is formed on the first electrode 23, the second electrode 24 and the first parallel face. A formation method of the protection layer 25 is not particularly limited and for example, silicon oxide or silicon nitride may be deposited by CVD or sputtering to form the layer 25.

2-3-7. Carrier Formation Step

Further, before the second parallel face formation step, a carrier formation step may be provided. In the carrier formation step, for example, the carrier 22 may be formed on the substrate 21 by CVD or sputtering of an insulating material. Further, a heat oxidation film may also be formed by subjecting the substrate 21 to a heat treatment.

2-3-8. Reflective Layer Formation Step

Moreover, before the carrier formation step, a reflective layer formation step may be provided. In the reflective layer formation step, for example, a reflective layer may be formed on the substrate 21 by CVD or sputtering.

2-4. Display Including Light Emitting Device

It is also made possible to produce a display by forming a plurality of light emitting devices of the invention on a single substrate. Further, particularly, the germanium light emitters 28 are made to be fine particles containing GeO and $GeO_2$, so that EL emission having a peak wavelength in a wavelength of 250 to 500 nm is made possible. Light with such a short wavelength can be used directly for a display and for emission application with different wavelengths by mounting a color conversion device or a color filter on a light emitting device.

2-5. Ion Implantation Condition Simulation for Germanium Ions

Figure 17:
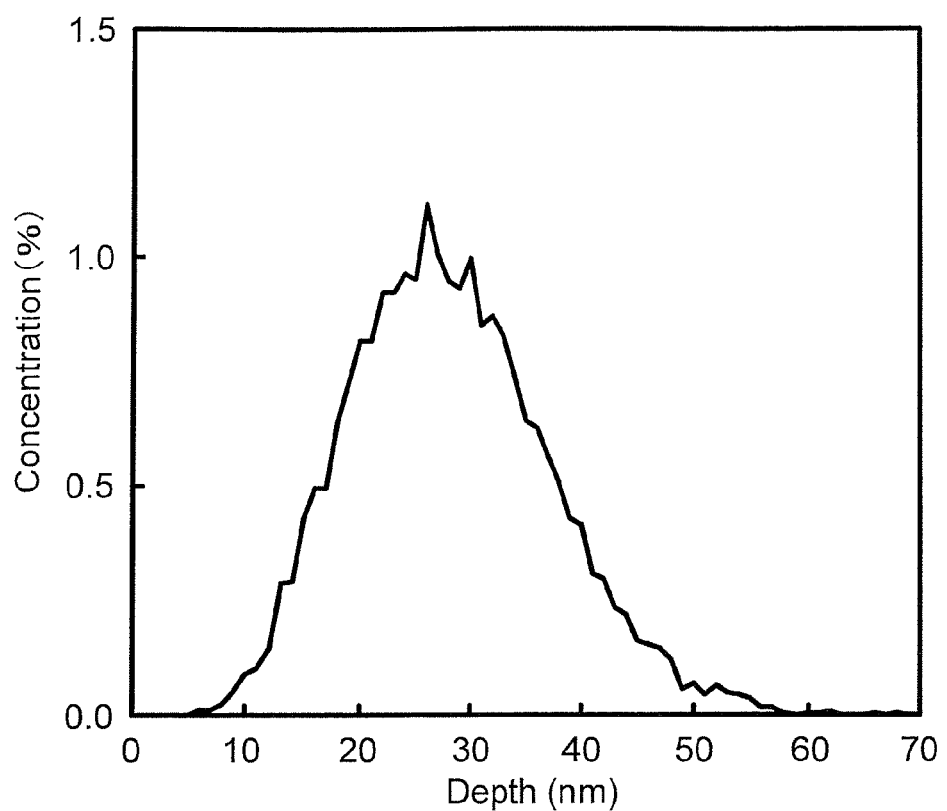
FIG. 17: a graph showing a relation between a distance in the depth direction of a carrier and a germanium ion concentration in an ion implantation condition simulation of a germanium ion in accordance with the invention.

Germanium ion implantation into the carrier 22 under the first parallel face in the light emitting region formation step is simulated. FIG. 17 is a graph showing a relation between a distance of the carrier 22 in the depth direction and a germanium ion concentration in the ion implantation condition simulation of germanium ions.

Using TRIM for the simulation, simulation is carried out such that a peak concentration of germanium becomes 1% and implantation conditions are 30 keV and $1.5 \times 10^{15}/cm^2$. An abscissa axis of FIG. 17 is a depth of the silicon oxide layer, which is the carrier 22 and an interface of the silicon oxide layer of the carrier 22 and the silicon oxide layer of the protection layer 25 is defined as a starting point. Further, in this simulation, it is assumed that the distance between the first parallel face and the second parallel faces of the carrier 22 is 50 nm and that the thickness d3 of the silicon oxide layer, which is the carrier 22 under the second parallel faces is 200 nm. Furthermore, the density of the silicon oxide layer of the carrier 22 is assumed to be 2.2 $g/cm^3$.

As being understood from FIG. 17, an implantation distribution is the Gauss type distribution and a peak depth is about 27 nm and a half width is about 20 nm. The germanium concentration can be adjusted by changing the dose and the peak depth can be changed by changing the dose energy. A desired profile can also be obtained by carrying out ion implantation many times.

3. Third Embodiment

A light emitting device of this embodiment includes a first electrode, a light transmitting second electrode, and a carrier formed between the first electrode and the second electrode and containing germanium light emitters in the inside thereof, wherein the first electrode has a plurality of projections on a surface having contact with the carrier and a length between upper ends of the projections and the second electrode is shorter than a length between parts of the first electrode other than the projections and the second electrode. Third embodiment of the invention provides a light emitting device having high light emitting efficiency, lowering operation voltage, and capable of emitting light without unevenness.

Figure 25:
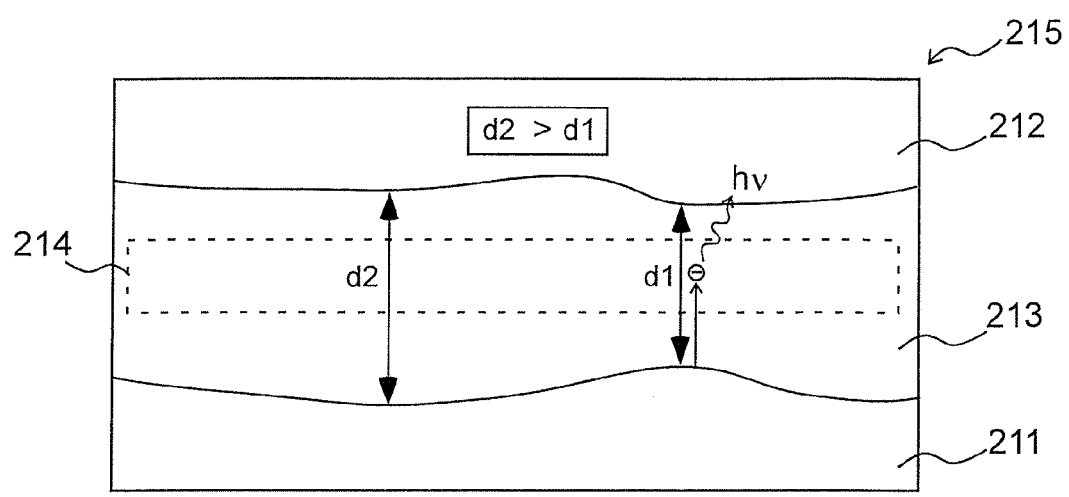
FIG. 25: a schematic cross-sectional view of a conventional light emitting device in which fine particles are formed in an insulating film.

It is found that a reason of unevenness of emission in a conventional light emitting device in which light emitters are formed in an insulating film is because a length between electrodes is not even. It will be described with reference to drawings. FIG. 25 is a schematic cross-sectional view of a conventional light emitting device in which phosphors as light emitters are dispersed in a light emitting region 214 in an insulating film 213. As shown in FIG. 25, in a case of a conventional light emitting device 215, a length between a silicon substrate 211 and an ITO electrode 212 is uneven. It is caused by slight curves and scratches of a surface of the silicon substrate 211 and the insulating film 213 and a formation state of the ITO electrode 212. That is, parts with a length d1 and a length d2 (d2>d1) are formed between the silicon substrate 211 and the ITO electrode 212. In this case, when a voltage is applied between the silicon substrate 211 and the ITO electrode 212 and thus an electric field with an intensity as high as about 7 MV/cm is applied to the insulating film 213, electrons are intensively concentrated in parts with a shorter length between the substrate 211 and the ITO electrode 212, that is, the parts with d1 and the emission is supposed to be strong as compared with other parts. Further, in parts with a longer length between the substrate 211 and the ITO electrode 212, that is, the parts with d2, electrons are hard to be supplied and thus the parts are supposed to emit no light or merely slight light. Therefore, it is supposed that the emission is uneven in the conventional light emitting device 215.

Investigations on a method for eliminating unevenness of the emission have been carried out and accordingly, it have been found that if a light emitting device is manufactured such that parts with a short length between electrodes in both sides of an insulating film are distributed evenly, electrons can be supplied selectively to these parts and thus these parts are selectively enabled to emit light.

Figure 18A:
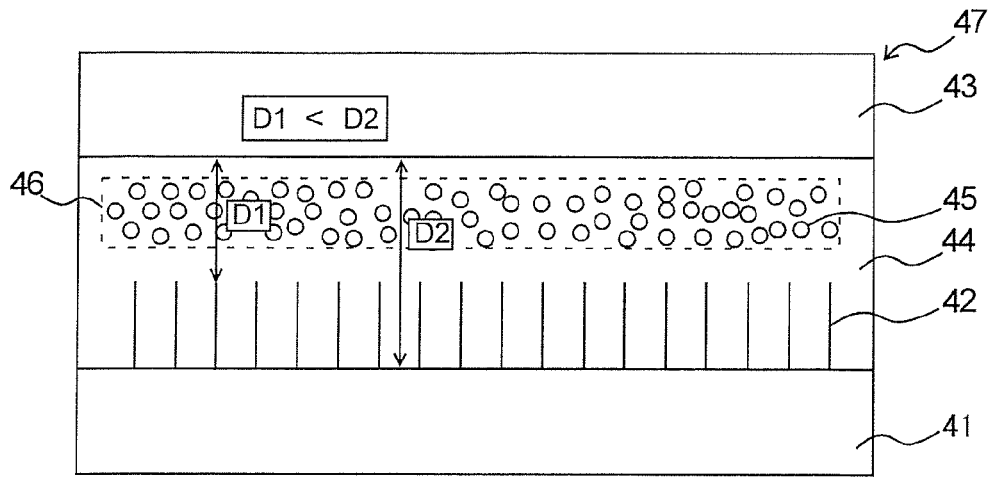
FIGS. 18A to 18C: schematic cross-sectional views of a light emitting device of an embodiment of the invention in an etching step.
Figure 18B:
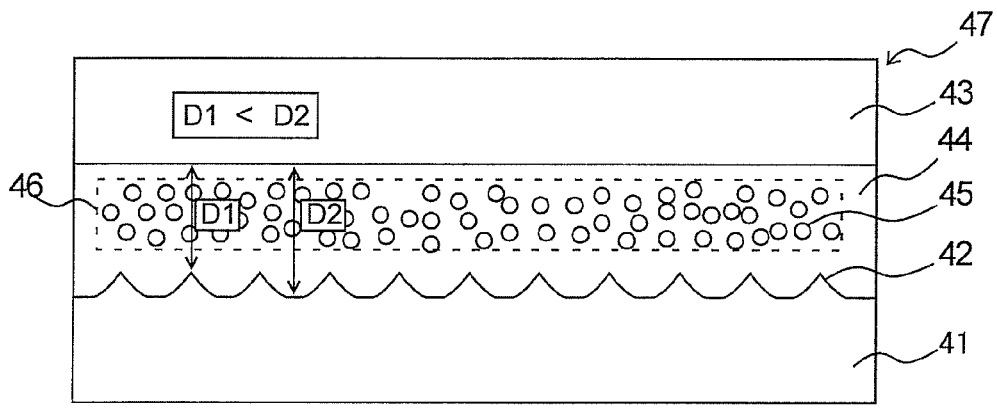
Figure 18C:
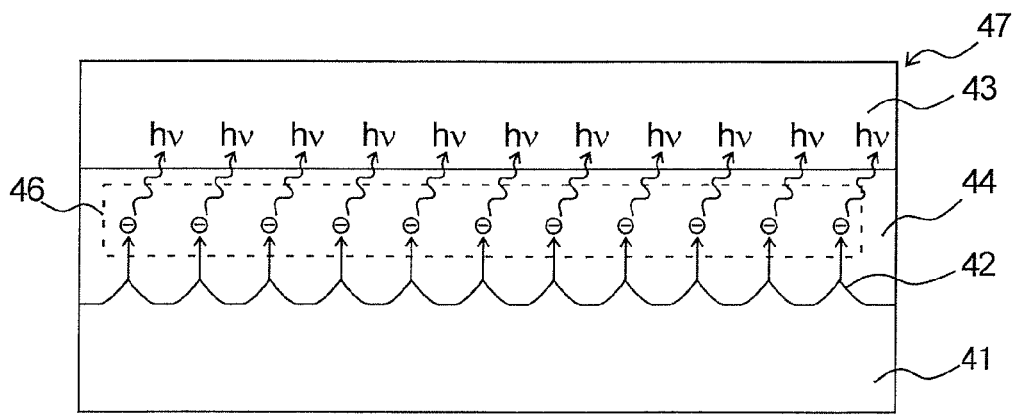

It will be described with reference to drawings. FIG. 18A is a schematic cross-sectional view of a light emitting device of one embedment of the invention using carbon nanotubes as the projections. FIG. 18B is a schematic cross-sectional view of a light emitting device of one embedment of the invention including conical projections. FIG. 18C is a schematic cross-sectional view of a light emitting device of one embedment of the invention in a case where a voltage is applied between the first electrode and the second electrode.

With respect to a light emitting device 47 of the invention, as shown in FIGS. 18A and 18B, a length D1 between upper ends of projections 42 and a second electrode 43 becomes shorter than a length D2 between a first electrode 41 and the second electrode 43. When a voltage is applied between the first electrode 41 and the second electrode 43 of the light emitting device 47 of the invention, an electric field to be applied to a carrier 44 between the upper ends of the projections 42 and the second electrode 43 becomes larger than that to be applied to the carrier 44 between the parts of the first electrode 41 having no projections 42 and the second electrode 43. Further due to an effect of an electric field concentration upon tip ends of the projections, electrons of the upper ends of the projections 42 are more easily supplied to the carrier 44 than electrons of the upper ends of the parts of the first electrode 41 having no projections 42. Accordingly, electrons flow selectively between the upper ends of the projections 42 and the second electrode 43.

The electrons supplied from the upper ends of the projections 42 and flowing in the carrier 44 are accelerated by the electric field applied between the first electrode 41 and the second electrode 43. The light emitting device 47 of the invention emits light by the accelerated electrons; however the mechanism is not made clear. For example, it is supposed as follows. The accelerated electrons cause mutual reaction with germanium light emitters 45 in the carrier 44, so that electrons of the germanium light emitters 45 can be excited and the germanium light emitters 45 emit light. Alternatively, it is supposed that after an energy of the accelerated electrons is once converted into another energy such as electromagnetic wave or the like, the energy is supplied to the germanium light emitters 45 to make the germanium light emitters 45 emit light. It is therefore supposed that an energy is directly or indirectly supplied to excite electrons of the germanium light emitters 45 in such a manner and thus the germanium light emitters 45 can emit light.

Further, in the light emitting device 47 of the invention, since the projections 42 can be distributed evenly on a surface of the first electrode 41, emission is made possible in a light emitting region 46 between the projections 42 distributed evenly as shown in FIG. 18C and the second electrode 43. As a result, emission does not become uneven in the light emitting device 47 of the invention. In addition, although in this description, although it is described that electrons are supplied from the first electrode 41, the same effect can be caused also in a case where electrons are supplied from the second electrode 43.

Further, it is made easy to supply the electrons of the upper ends of the projections 42 by making the upper parts of the projections 42 have a sharpened shape. Accordingly, it is made easy to emit light by the germanium light emitters 45 between the upper ends of the projections 42 and the second electrode 43. Further, the light emitting region 46 emitting light can be more evenly by making the upper parts of the projections 42 have the sharpened shape.

Moreover, in the light emitting device 47 of this embodiment, since the germanium light emitters 45 are germanium oxide having partial oxygen deficiency, electroluminescence emission is made possible particularly in a short wavelength region from ultraviolet to blue color (about 250 to 500 nm) by voltage application. Emission of a conventional light emitting device is mainly in a visible light region and also the emission is almost entirely red color in a relatively long wavelength region. Hereafter, it is supposed that requirements for optical communication using very thin wiring or wiring of various materials, such as fine waveguides in integrated semiconductor circuits, are increased. For this reason, if it is assumed that various wavelengths suitable for use modes are needed, light emitting devices emitting light not only in an existing wavelength but also in a shorter wavelength region become indispensable. Further, the light with a short wavelength can easily be converted to light with a long wavelength by using phosphors and thus various lights can be produced. Accordingly, it is expected that the light emitting device of the invention can be applied not only to optical communication fields but also to color displays or the like.

Hereinafter, one embodiment of the invention will be described with reference to drawings. The drawings and the configuration described as follows are illustrative and a scope of the invention is not limited to the drawings and following descriptions.

3-1. Structure of Light Emitting Device

A light emitting device 47 of this embodiment includes a first electrode 41, a translucent second electrode 43, and a translucent carrier 44 formed between the first electrode 41 and the second electrode 43 and containing germanium light emitters 45 in the inside thereof, wherein the first electrode 41 has a plurality of projections 42 on a surface having contact with the carrier 44 and a length of upper ends of the projections 42 and the second electrode 43 is shorter than a length between parts of the first electrode 41 other than the projections 42 and the second electrode 43.

When a voltage is applied between the first electrode 41 and the second electrode 43, light is emitted from the germanium light emitters 45.

Hereinafter, each constituent element of the light emitting device 47 of this embodiment will be described.

3-1-1. First Electrode

The first electrode 41 is not particularly limited if it is made of a conductive substance and having a plurality of the projections 42 on the surface having contact with the carrier 44. The first electrode 41 and the projections 42 may be made of the same material or different materials. For example, a part of the first electrode 41 other than the projections 42 is a conductive silicon substrate.

3-1-2. Projections

The projections 42 are not particularly limited if they are made of a conductive substance and are formed on a surface of the first electrode 41 having contact with the insulating part. The projections 42 may be made of the same material as or a different material from the material of the first electrode 41.

The projections 42 may be carbon nanotubes or may be a conical metal or silicon. Further, the projections 42 may contain silicon or carbon as a main component.

A length D1 between upper ends of the projections 42 and the second electrode 43 is shorter than a length D2 of parts of the first electrode 41 having no projections 42 and the second electrode 43. Accordingly, when a voltage is applied between the first electrode 41 and the second electrode 43, an electric field applied to the carrier 44 between the upper ends of the projections 42 and the second electrode 43 is larger than an electric field applied between the parts of the first electrode 41 having no projections 42 and the second electrode 43. As a result, electron emission tends to be caused more easily between the upper ends of the projections 42 and the second electrode 43 and electron ejection is caused more easily in a light emission region between the upper ends of the projections 42 and the second electrode 43.

Further, a length between a part of the first electrode 41 other than the projections 42 and the second electrode 43 may be adjusted to 1.1 times or more (e.g. 1.1, 1.2, 1.3, 1.4, 1.5, 1.6, 1.7, 1.8, 1.9 or 2 times or higher) as long as the length between the upper ends of the projections 42 and the second electrode 43. Accordingly, emission is made easier in the light emitting region 46 between the upper ends of the projections 42 and the second electrode 43.

Moreover, the length between the upper ends of the projections 42 and the second electrode 43 may be adjusted to 5 nm or longer and 100 nm or shorter (e.g. in a range between whichever numerals of 5, 10, 20, 30, 40, 50, 60, 79, 80, 90, and 100 nm). Accordingly, it is made easy to emit electrons between the upper ends of the projections 42 and the second electrode 43.

The projections 42 can be formed evenly on the surface of the first electrode 41 having contact with the carrier 44 in the first electrode 41 side of the light emitting region 46 (a region where the germanium light emitters 45 are formed). Accordingly, the light emitting region 46 where emission is caused easily between the upper ends of the projections 42 and the second electrode 43 can be formed evenly in the light emitting region 46. Accordingly, unevenness of emission of the light emitting device 47 of this embodiment can be eliminated. In this connection, "even(ly)" in this embodiment means that in a case where the surface of the first electrode 41 is divided uniformly so as to contain a constant number of the projections 42, a variation in the number of projections formed on the surface of the divided first electrode is little.

Further, the upper parts of the projections 42 may be formed to have a sharpened shape. Herein, the sharpened shape means a shape having an angle of 0 degree or higher and 150 degrees or longer. In this connection, if the projections 42 have the angle as an entire shape, the projections 42 may include those having round corner parts. Further, the sharpened shape may be a shape having one summit such as a cone or a pyramid and may also be a shape having a line as a summit such as a blade of a kitchen knife. The shape may be, for example, a rod-like shape and also a summit point of the sharpened shape may have a form facing toward the second electrode 43. Electron ejection is caused easily between the sharpened parts of the projections 42 and the second electrode 43 by making the upper parts of the projections 42 have the sharpened shape. Further, since the sharpened parts may be formed in a form of dots or lines, so that the light emitting region where emission is caused easily between the upper ends of the projections 42 and the second electrode 43 can be formed evenly in the light emitting region 46. Furthermore, with respect to a cross-sectional face cut along a plane including the summit, each of the projections may be formed to have a ridge line having a downward convex shape or to make a curvature radius of the summit smaller. In other words, each of the projections may have a conical shape with more moderate inclination as it goes far from the summit or a more sharpened shape in the most tip end part. In this case, the light emitting device is enabled to emit light by applying a low voltage between the first electrode 41 and the second electrode 43. Further, emission intensity can be increased by forming the projections in such a shape.

The neighboring two projections 42 are at an interval of 10 nm or wider and 3 μm or shorter (e.g. in a range between whichever two numerals of 10, 20, 30, 40, 50, 60, 70, 80, 90, 100, 150, 200, 300, 500, 1000, 2000, and 3000 nm). Accordingly, the light emitting region 46 where emission is caused easily between the upper ends of the projections 42 and the second electrode 43 can be formed evenly in the light emitting region 46.

3-1-3. Second Electrode

The second electrode 43 is not particularly limited in the configuration if it is made of a translucent conductive material and suitable for applying a voltage between the first electrode 41 and suitable for applying an electric field to the carrier 44. For example, the second electrode 43 may be an ITO electrode. In this connection, in the invention, the translucent property means capability of transmitting light of a light emitting wavelength of a light emitting device.

3-1-4. Carrier

The carrier 44 is not particularly limited if it is formed between the first electrode 41 and the second electrode 43 and contains the germanium light emitters 45 in the inside thereof and is capable of extracting light and emitting light by a voltage application. It is typically a translucent insulator. Further, it may be a semiconductor with a low impurity concentration. In this case, a distance between the germanium light emitters 45, which are light emitting sources, and the second electrode 43 is preferably short. For example, in a case of a wide gap semiconductor of SiC or GaN, if a thickness thereof is about 100 nm or thinner, about 40 to 80% of the light with a wavelength of about 250 to 500 nm can be transmitted. That is, the carrier is not in a bulk state and in a situation of using it actually in the invention, the carrier may be proper if it contains the germanium light emitters 45 in the inside thereof and has a translucent property and emits light by electron supply between the first electrode and the second electrode by voltage application. The light transmittance of the carrier is not particularly limited; however it is preferable that the transmittance of light with a wavelength range of 250 to 500 nm is 50% or higher and 99.99% or lower. In a case where the germanium light emitters 45 are fine particles containing GeO and $GeO_2$, a peak wavelength of a light emitted from the carrier 44 containing the germanium light emitters 45 is around 300 and 400 nm, and therefore if the transmittance of light with a wavelength of 300 to 500 nm is higher, light extraction efficiency can be heightened correspondingly and therefore it is preferable. Further, a material of the carrier 44 is not particularly limited; however it is preferable to be made of an insulator. It is because, in this case, electric current flowing between the electrodes without contributing to emission can be lowered and effective light emitting efficiency can be improved and emission is made possible at a low power consumption. The carrier 44 is, for example, made of silicon oxide, silicon nitride, or silicon oxynitride. In this case, since the carrier is a silicon type insulating film and silicon is easier to be bonded with oxygen than germanium, germanium atoms are not unnecessarily bonded with oxygen and also silicon oxide, silicon nitride, or silicon oxynitride is relatively hard to transmit oxygen and therefore germanium atoms are not oxidized due to outside air penetration and accordingly, emission is stabilized and is scarcely deteriorated. Further, silicon oxide, silicon nitride, or silicon oxynitride is formed into a film in common silicon semiconductor process and is thus excellent in mass productivity and suitable for combination with other electronic circuits.

A thickness of the carrier 44 is, for example, 5 nm or thicker and 100 nm or thinner (e.g. in a range between whichever two numerals of 5, 10, 20, 30, 40, 50, 60, 70, 80, 90 and 100 nm) at the upper end parts of the projections 42 and, for example, 12 nm or thicker and 1000 nm or thinner at parts other than the projections 42.

Further, the light transmittance of the carrier 44 is preferably 50% or higher of the transmittance of light with a wavelength range of, for example, 250 to 500 nm. In a case where the germanium light emitters 45 are fine particles containing GeO and $GeO_2$, a peak wavelength of light emitted from the germanium light emitters 45 is around 390 nm and if the transmittance of light with a wavelength range of 300 to 500 nm is higher, light extraction efficiency can be heightened more correspondingly, and therefore it is preferable.

Further, in a case where the carrier 44 is made of silicon oxide, silicon nitride, or silicon oxynitride and projections 42 are made of mainly silicon or carbon, the properties are stabilized. It is supposed that along with ejection of electrons from tips of the projections 42, atoms constituting the projections 42, that is, silicon and carbon is suppressed from dissociation in a case of silicon or carbon and therefore, an electron ejecting property can be stabilized. It is because if deterioration is caused, height and shape of the projections 42 are changed and intensity of the electric field is changed.

3-1-5. Germanium Light Emitters

The germanium light emitters 45 are not particularly limited if they are formed in the carrier 44 and to be light emitting sources. Further, a plurality of the germanium light emitters 45 may be formed in the carrier 44.

Further, the germanium light emitters 45 are, for example, fine particles of germanium. The germanium light emitters 45 may also be, for example, fine particles containing GeO and $GeO_2$. In this case, the germanium light emitters 45 may contain germanium (metal).

The number density of the germanium light emitters 45 in the light emitting region 46 is not particularly limited; however it is $1\times10^{16}$ particles/cm$^3$ to $1\times10^{21}$ particles/cm$^3$.

3-1-6. Light Emitting Region

The light emitting region 46 is a region in the inside of the carrier 44 where the germanium light emitters 45 are formed and a region capable of emitting light when a voltage is applied between the first electrode 41 and the second electrode 43. The light emitting region 46 may be formed in the entire carrier 44 or in a part of the carrier 44.

3-2. Method for Manufacturing the Light Emitting Device 3-2-1. Formation of First Electrode The first electrode 41 having the projections 42 can be formed by, for example, using a conductive silicon substrate. Herein, a formation method using etching, a formation method using leaser annealing, and a method for forming carbon nanotubes will be described as examples.

3-2-1-1. Formation Method Using Etching

Dot-like etching masks are formed on the surface of the first electrode 41 and the surface of the first electrode 41 is etched. In the etching, the first electrode 41 on which the masks are not formed is removed and outside of the first electrode 41 under the dot-like etching masks is gradually removed. When the etching is continued, the first electrode 41 having the summits with a conical shape immediately under the center parts of the dot-like etching masks can be left without being etched. After that, the masks are removed to form the first electrode 41 having the conical projections 42.

3-2-1-2. Formation Method Using Laser Annealing

For example, a silicon substrate is irradiated with coherent linear polarized laser beam while being moved transversely and this irradiation is successively carried out in the vertical direction of the silicon substrate to carry out annealing treatment. In this annealing treatment, a temperature distribution is generated in the silicon substrate corresponding to cyclic light intensity distribution. Therefore, a stripe-like form having cyclic modulation can be formed on a surface of the silicon substrate. Further the silicon substrate is turned at 90° around a vertical axis of an irradiation face and is again irradiated with laser beam to carry out similar annealing treatment. Accordingly, the first electrode 41 having island-like projections 42 at crossing points of the stripes crossing at 90° can be formed. For example, in a case where laser with wavelength of 532 nm is carried out, the first electrode 41 having the projections at intervals about 500 to 550 nm and having height of 30 to 50 nm can be formed.

3-2-1-3. Formation of Carbon Nanotubes

In carbon nanotube growth on the surface of the first electrode 41 by a coating method, a material having a catalytic function (e.g. ferric metals such as iron, nickel, cobalt, or the like; platinum, rhodium, or the like) is formed and thereafter, a hydrocarbon type gas such as methane, ethane, propane, ethylene, propylene, or the like is flown and carbon nanotubes are formed on the surface of the first electrode 41 by a thermal CVD method or a plasma CVD method.

3-2-2. Formation of Carrier

The carrier 44 can be formed on the first electrode 41. For example, silicon oxide or silicon nitride is deposited by CVD or sputtering to form the carrier 44 on the first electrode 41. Since the projections 42 are formed on the surface of the first electrode 41, the projections reflecting the projections may be formed on the upper face of the carrier 44 in some cases; however, in this case, the upper face of the carrier 44 can be flattened by CMP or the like.

3-2-3. Formation of Germanium Light Emitters

The germanium light emitters 45 are formed in the inside of the carrier 44. A method for forming the germanium light emitters 45 in the carrier 44 is not particularly limited; however, as one example, it is supposed a method of ion implantation of germanium ions into the carrier 44. In a case where the germanium light emitters 45 are fine particles containing GeO and $GeO_2$, a method supposed to be possible may involve ion implanting germanium into the carrier 44 and thereafter carrying out a heat treatment. The ions are agglomerated by the heat treatment after the ion implantation and a large number of fine particles are formed in the carrier 44 Ge is oxidized to form GeO and $GeO_2$. The ion implantation of germanium can be carried out in conditions of, for example, an implantation energy of 5 to 100 keV and an implantation amount of $1\times10^{14}$ to $1\times10^{17}$ ions/cm$^2$.

Further, the ion implantation is preferably carried out to adjust a germanium concentration in the carrier 44 to be 0.1 to 20% by atom. It is because in a case where an inert gas (50 ml/min) is supplied while vacuum evacuation (400 l/min) is carried out in the heat treatment at 800° C. for 1 hour, emission is made possible in the range. The germanium concentration is specifically 0.1, 0.2, 0.5, 1.0, 1.4, 2, 3, 5, 6, 10, 11, 15, and 20% by atom. Further preferably, it is 2 to 11% by atom. The concentration may be in a range between whichever two numeral values exemplified above. In an EL experiment, emission can be confirmed with eyes even at 2% by atom or higher and emission intensity is lowered if it exceeds 11% by atom and therefore, if it is in this range, it is supposed that light emitting efficiency can be improved. The germanium concentration can be measured by a high reaction solution RBS (Rutherford Back Scattering) method. Besides, measurement is made possible by various analysis methods such as SIMS (Secondary Ion Mass Spectroscopy). The measurement of the germanium concentration is carried out in a range of ¹⁄₁₀₀ of a peak value of the germanium concentration. The temperature of the heat treatment is preferably 400 to 1000° C. and more preferably 700 to 900° C. It is because if it is in this range, the light emitting efficiency is supposed to be relatively high as the EL experiment result.

3-2-4. Formation of Second Electrode

The translucent second electrode 43 is formed on the carrier 44 in which the germanium light emitters 45 are formed. For example, an ITO electrode may be formed by sputtering.

Next, after the projections of silicon are formed on a silicon substrate by the method employing etching, additionally, a silicon oxide film is formed and a light emitting device is manufactured in the same steps as those described above and an EL experiment is carried out. As a result, a DC voltage necessary for emission is about 50% at maximum and is thus lowered. Further, evenness of luminance in a light emitting region is also improved.

Further, EL devices using ZnS fine particles on a silicon substrate on which the projections are formed or a silicon substrate on which no projections are formed are manufactured and the same EL experiment is carried out. When devices in which the projections are formed and devices in which no projections are formed are compared to find that an AC voltage necessary for emission for the devices in which the projections are formed is lowered by about 10% than the devices in which no projections are formed.

As described, it is confirmed that the invention can suppress the unevenness of emission and lower the operation voltage.

4. Fourth Embodiment

A light emitting device of this embodiment includes a substrate having a p-type semiconductor part and an n-type semiconductor part including pn-junction, which is a first electrode at least in an upper face; a translucent carrier formed on the substrate and containing germanium light emitters in the inside thereof; a translucent electrode, which is a second electrode, formed on the carrier; a third electrode formed on a surface of the p-type semiconductor part and on a part of a surface where the carrier is not formed; and a fourth electrode formed on a surface of the n-type semiconductor part and on a part of a surface where the carrier is not formed, wherein the carrier and the translucent electrode are formed in this order on the pn-junction part of the p-type semiconductor part and the n-type semiconductor part on the upper face of the substrate. The light emitting device of this embodiment can emit light at high light emitting efficiency without unevenness. As compared with a conventional light emitting device which requires application of an electric field with intensity as high as several MV/cm to an insulating film, the light emitting device has high light emitting efficiency. Further, the light emitting device is free from a problem that if the electric field is converged upon one point of an insulating film, an entire body of the light emitting device is broken and also free from a problem that emission is uneven.

In the light emitting device of this embodiment, it is found that when a negative voltage is applied to the third electrode connected to the p-type semiconductor part; a positive electrode is applied to the translucent electrode; and the fourth electrode connected to the n-type semiconductor part is at a potential between the third electrode and the translucent electrode, for example, earthed; the light emitting device is enabled to emit light efficiently at a lower voltage than a conventional light emitting device utilizing FN tunneling. It will be described with reference to drawings.

Figure 19:
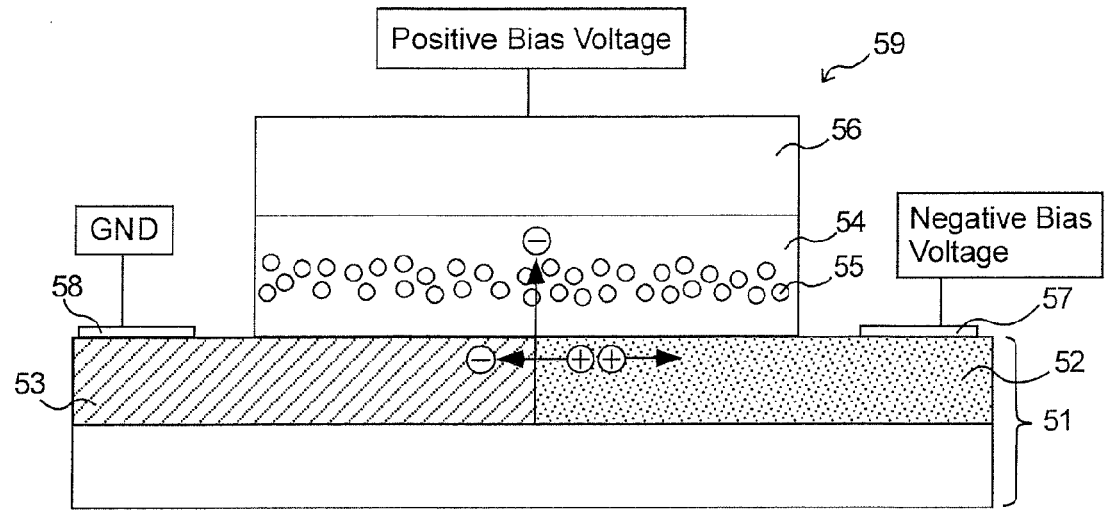
FIG. 19: a schematic cross-sectional view of a light emitting device of an embodiment of the invention.
Figure 20:
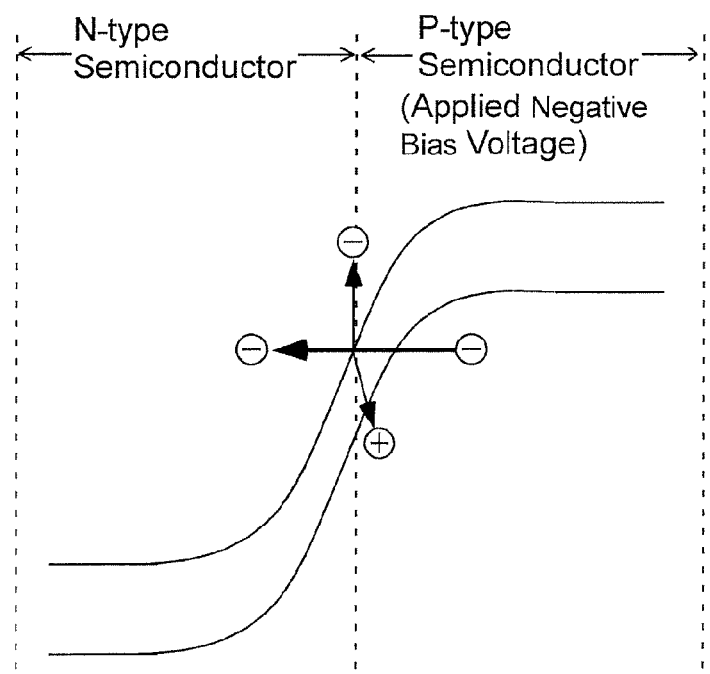
FIG. 20: a band drawing of a semiconductor in a vicinity of pn-junction of a light emitting device of an embodiment of the invention.

FIG. 19 is a schematic cross-sectional drawing of a light emitting device of one embodiment of the invention. FIG. 20 is a band drawing of a semiconductor in a vicinity of pn-junction of a light emitting device of one embodiment of the invention. As shown in FIG. 19, when a negative voltage is applied to a third electrode 57 of a light emitting device 59 and GND voltage is applied to a fourth electrode 58, reverse bias is generated and if a potential difference is low, no electric current flows between a p-type semiconductor part 52 and an n-type semiconductor part 53. When a certainly high negative voltage is applied to the third electrode 57, an energy band as shown in FIG. 20 is generated and an electric field applied to a junction part becomes intense and therefore, tunnel electric current is generated owing to a flow of electrons of a valence band of the p-type semiconductor to a conduction band of the n-type semiconductor. The electrons of the valence band of the p-type semiconductor flowing to the conduction band of the n-type semiconductor are accelerated by an electric field between the third electrode 57 and the fourth electrode 58 or an electric field between the third electrode 57 and a translucent electrode 56 applied a positive voltage and come into collision against lattice atoms to generate pairs of hot electrons and hot holes. Some of the hot electrons are accelerated by an electric field between the third electrode 57 and the translucent electrode 56 or between the fourth electrode 58 and the translucent electrode 56 and supplied to the carrier 54. It is supposed that the hot electrons cause mutual reaction with the germanium light emitters 55 in the inside of the carrier 54 and excite an energy level of the germanium light emitters 55 to enable the germanium light emitters 55 to emit light.

Hereinafter, the explanation relevant to a light emission principle will be given while exemplifying the hot electrons and in a case where a negative voltage is applied to the translucent electrode 56, the hot holes cause mutual reaction with the germanium light emitters 55 in the inside of the carrier 54 and excite the energy level of the germanium light emitters 55 and therefore, it is supposed to be possible to emit light same as described above.

In order to enable the light emitting device 59 to emit light, it is required that an electric field sufficient to generate tunnel electric current is applied between the third electrode 57 and the fourth electrode 58 and also an electric field sufficient to supply the generated hot electrons to the carrier 54 is applied between the third electrode 57 and the translucent electrode 56 or between the fourth electrode 58 and the translucent electrode 56. The electric field to be applied between the third electrode 57 and the translucent electrode 56 or between the fourth electrode 58 and the translucent electrode 56 is lower than an electric field sufficient to supply electrons to the conduction band of the carrier 54 by FN tunneling. Accordingly, in the light emitting device 59, electron implantation efficiency to the carrier 54 becomes high as compared with that of FN tunneling. A ratio of the electron implantation efficiency of the light emitting device 59 of the invention and the electron implantation efficiency of a conventional light emitting device utilizing FN tunneling is calculated to be about 7:1 from experiment results. Accordingly, the light emitting device of the invention is enabled to efficiently emit light at a low voltage as compared with the conventional light emitting device utilizing FN tunneling. Further, in a case where the same voltage is applied to the light emitting device of the invention and to a conventional light emitting device, luminance of the light emitting device of the invention becomes higher. Further, in a case of the light emitting device of the invention, a problem that the electric field is converged upon one point of the carrier and the entire device is broken is not caused.

Further, in a case of an electron implantation method using FN tunneling as shown in a conventional example, since a generation site and an acceleration site of the hot electrons are carriers, when a needed voltage is applied, the carrier is considerably damaged, whereas according to the electron implantation method of the invention, the hot electron generation site is the pn junction part and also the acceleration site is the carrier and thus both are separated and there is an advantage that the damage on the carrier by high electric field application is slight.

Further, in a case of a conventional light emitting device utilizing FN tunneling, emission is intensely generated at a point where the electric field between electrodes becomes maximum and emission is scarcely generated at a point where the electric field between electrodes is slight and thus uneven emission is generated. Accordingly, unevenness of a film thickness of the carrier 54 directly affects unevenness of the emission.

On the other hand, with respect to the light emitting device 59 of the invention, it is supposed that hot electrons generated in a vicinity of the pn-junction in the substrate 51 come into collision against the germanium light emitters 55 to enable the germanium light emitters 55 to emit light. An energy of the hot electrons generated by this method is determined in accordance with the electric field applied between the third electrode 57 and the translucent electrode 56 or between the fourth electrode 58 and the translucent electrode 56 and thus the energy which the hot electrons obtain is determined regardless of the film thickness unevenness of the carrier 54. Accordingly, since the effect of the film thickness of the carrier 54 is slight, unevenness of the emission can be suppressed low.

Further, since the germanium light emitters 55 which emit light in the carrier 54 can be set evenly by forming the pn-junction at a constant interval on the upper face of the substrate 51 adjacent to the carrier 54 or forming evenly the pn-junction and therefore, unevenness of the emission can be eliminated.

Further, the light emitting device of the invention can emit electroluminescence in a short wavelength region particularly from ultraviolet to blue color (about 250 to 500 nm) by voltage application. Emission of a conventional light emitting device is mainly in a visible light region and also the emission is almost entirely red color in a relatively long wavelength region. Hereafter, it is supposed that requirements for optical communication using very thin wiring or wiring of various materials, such as fine waveguides in integrated semiconductor circuits, are increased. For this reason, if it is assumed that various wavelengths suitable for use modes are needed, light emitting devices emitting light not only in an existing wavelength but also in a shorter wavelength region become indispensable. Further, the light with a short wavelength can easily be converted to light with a long wavelength by using phosphors and thus various lights can be produced. Accordingly, it is expected that the light emitting device of the invention can be applied not only to optical communication fields but also to solid-state illumination instead of a fluorescent lamp, color displays or the like.

Hereinafter, one embodiment of the invention will be described with reference to drawings. The drawings and the configuration described as follows are illustrative and a scope of the invention is not limited to the drawings and following descriptions.

4-1. Structure of Light Emitting Device

A light emitting device 59 of this embodiment includes a substrate 51 having a p-type semiconductor part 52 and an n-type semiconductor part 53 including pn-junction at least in an upper face; a translucent carrier 54 formed on the substrate 51 and containing germanium light emitters 55 in the inside thereof; a translucent electrode 56 formed on the carrier 54; a third electrode 57 formed on a surface of the p-type semiconductor part and on a part of a surface where the carrier is not formed; and a fourth electrode 58 formed on a surface of the n-type semiconductor part and on a part of a surface where the carrier is not formed, wherein the carrier 54 and the translucent electrode 56 are formed in this order on the pn-junction part of the p-type semiconductor part 52 and the n-type semiconductor part 53 on the upper face of the substrate 51.

Hereinafter, each constituent element of the light emitting device 59 of this embodiment will be described.

4-1-1. Substrate

The substrate 51, which is a first electrode, is not particularly limited if it has the p-type semiconductor part 52 and the n-type semiconductor part 53 including pn-junction at least in an upper face. For example, it may be a p-type silicon substrate on which an n-type region is formed on an upper part or it may be an n-type silicon substrate on which a p-type region is formed on an upper part. Further, it may be a $SiO_2$ substrate on which a p-type silicon and an n-type silicon are formed and also it may be a Si substrate on which a carrier such as $SiO_2$ is formed and further a p-type silicon and an n-type silicon are formed thereon. In this case, the device of the invention may be formed on a SIO (Silicon On Insulator) substrate using a crystalline silicon substrate as the substrate or amorphous silicon may be formed on a carrier such as $SiO_2$ by a CVD method or the like and then the device of the invention may be formed thereon.

Figure 21A:
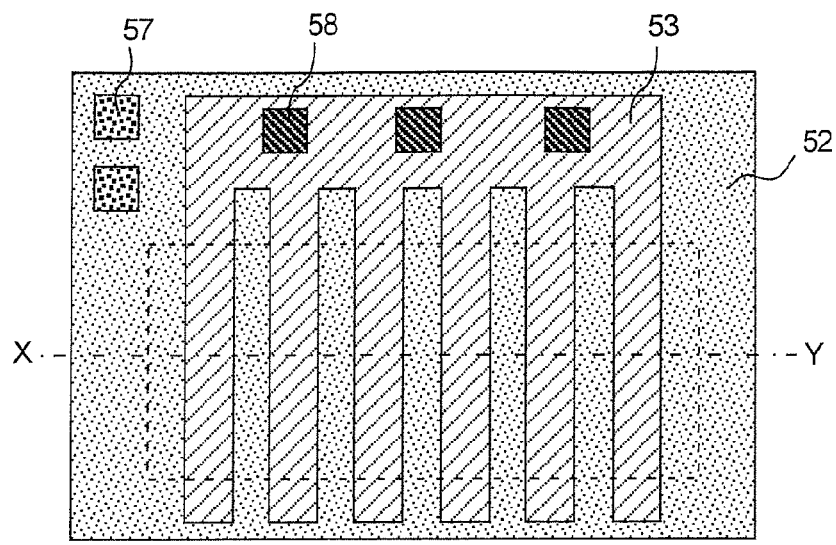
FIGS. 21A and 21B: one example of a substrate of a light emitting device of an embodiment of the invention.

FIG. 21A is one example of a substrate of the light emitting device of one embodiment of the invention and a plane view of a substrate obtained by forming an n-type silicon in comb-like form on an upper face of a p-type silicon substrate, forming the third electrode 57 on an upper face of the p-type silicon, and forming the fourth electrode 58 on an upper face of the n-type silicon.

Figure 21B:
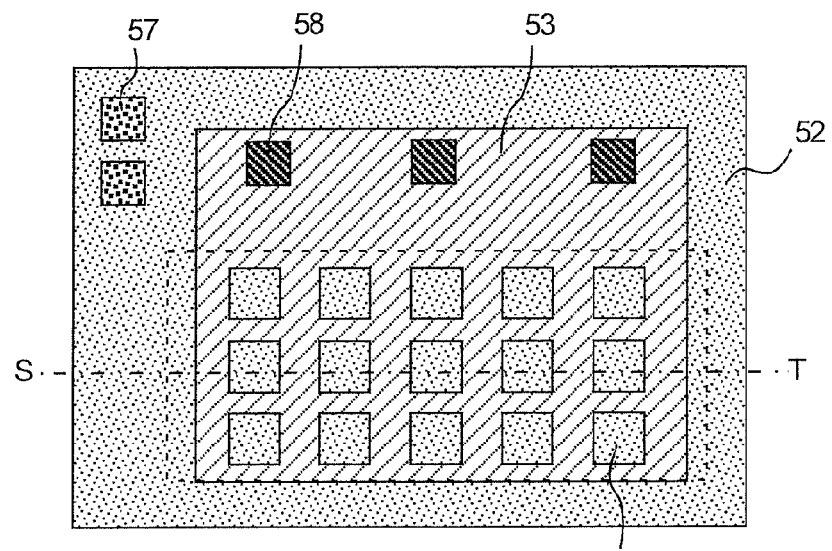
Figure 21C:
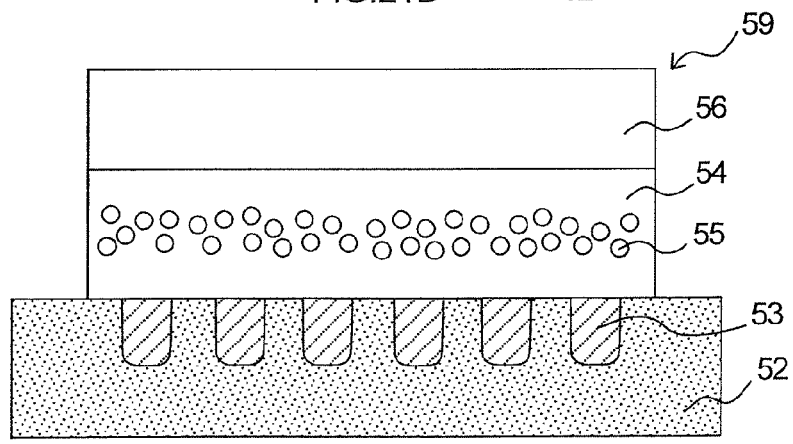
FIG. 21C: a schematic cross-sectional view of the light emitting device along with a dotted line X-Y of FIG. 21A or along with a dotted line S-T of FIG. 21B.

In addition, the carrier 54 and the translucent electrode 56 may be formed in a part surrounded with a dotted line in FIG. 21A. FIG. 21B is one example of a substrate of the light emitting device of one embodiment of the invention and a plane view of a substrate obtained by forming an n-type silicon in a curb-like form on an upper face of a p-type silicon substrate, forming the third electrode 57 on an upper face of the p-type silicon, and forming the fourth electrode 58 on an upper face of the n-type silicon. In addition, the carrier 54 and the translucent electrode 56 may be formed in a part surrounded with a dotted line in FIG. 21B. FIG. 21C is a schematic cross-sectional view of the light emitting device cut along a one-point dotted line X-Y of FIG. 21A or along a one-point dotted line S-T of FIG. 21B. The substrate 51 is specifically formed as shown in FIGS. 21A to 21C.

4-1-2. p-Type Semiconductor Part

The p-type semiconductor part 52 is not particularly limited if it is a part of a p-type semiconductor contained in the substrate 51 and forms pn-junction with the n-type semiconductor part 53 and it may be, for example, p-type silicon and an impurity concentration is, for example, $1\times10^{16}$ to $1\times10^{20}/cm^3$ (e.g. in a range between whichever two numerals of $1\times10^{16}$, $1\times10^{17}$, and $1\times10^{18}$).

4-1-3. n-Type Semiconductor Part

The n-type semiconductor part 53 is not particularly limited if it is a part of a n-type semiconductor contained in the substrate 51 and forms pn-junction with the p-type semiconductor part 52 and it may be, for example, n-type silicon and an impurity concentration is, for example, $1\times10^{16}$ to $1\times10^{18}/m^3$.

The impurity concentrations of the p-type semiconductor part 52 and the n-type semiconductor part 53 are rough standards in a case where a positive voltage is applied to the translucent electrode 56 and GND voltage is applied to the n-type semiconductor part 53. As described above, the invention is supposed to exert the same emission effect even by applying GND voltage to the p-type semiconductor part 52 and applying a positive voltage to the n-type semiconductor part 53 and in this case, the impurity concentrations of the p-type semiconductor part 52 and the n-type semiconductor part 53 may be exchanged mutually with the rough standards.

4-1-4. pn-Junction

The pn-junction is an interface where the p-type semiconductor part 52 and the n-type semiconductor part 53 have contact with each other. Further, parts forming the pn-junction may be formed at constant intervals on the upper face of the substrate 51 adjacent to the carrier 54. Furthermore, the parts forming the pn-junction may be formed evenly on the upper face of the substrate 51 adjacent to the carrier 54. Specifically, the pn-junction may be formed as shown in FIG. 21A or 21B.

Accordingly, the carrier 54 is enabled to emit light without unevenness by applying a voltage to the light emitting device 59 of this embodiment. It is because of following: that is, in the light emitting device 59 of this embodiment, electrons are supplied to the carrier 44 from the semiconductor in a vicinity of the pn-junction to carry out emission and thus the germanium light emitters 55 between a part having the pn-junction and the translucent electrode 56 emit light.

Further, at least one of the p-type semiconductor part 52 and the n-type semiconductor part 53 may have an impurity concentration of $5 \times 10^{18}$ cm$^{-3}$ or higher. Furthermore, the p-type semiconductor part 52 and the n-type semiconductor part 53 may contain silicon as a main component.

The first electrode is made of a p-type semiconductor part and an n-type semiconductor part having pn-junction and includes a third electrode electrically connected with the p-type semiconductor part and a fourth electrode electrically connected with the n-type semiconductor part.

4-1-5. Third Electrode

The third electrode 57 is not particularly limited if it is formed on a surface of the p-type semiconductor part 52 and on a part of a surface where the carrier 54 is not formed and is proper for having an ohmic contact with the p-type semiconductor part 52. The third electrode 57 is, for example, Au, Pt, Ag, Co, Ni, Ti, Ta, W, etc.

4-1-6. Fourth Electrode

The fourth electrode 58 is not particularly limited if it is formed on the surface on the n-type semiconductor part 53 and on a part of a surface where the carrier 54 is not formed and is proper for having an ohmic contact with the n-type semiconductor part 53. The fourth electrode 58 is, for example, Au, Pt, Ag, Co, Ni, Ti, Ta, W, etc.

4-1-7. Second Electrode

In this embodiment, the translucent electrode 56, which is the second electrode, is not particularly limited if it is an electrode having a transmittance of light with a wavelength of 250 nm or longer and 500 nm or shorter of 50% or higher and 99.99% or lower. The translucent electrode 56 is, for example, a metal oxide thin film such as ITO, or a metal thin film of Al, Ti, or Ta, or a semiconductor thin film of Si, SiC, GaN, or the like.

4-1-8. Carrier

The carrier 54 is not particularly limited if it is formed on the substrate 51 and contains the germanium light emitters 55 in the inside thereof and has a translucent property. For example, the carrier 54 is made of silicon oxide, silicon nitride, or silicon oxynitride. In this case, the carrier is a silicon type insulating film and silicon is easier to be bonded with oxygen than germanium and therefore, a germanium atom is not unnecessarily bonded with an oxygen atom, and also silicon oxide, silicon nitride, or silicon oxynitride is relatively hard to transmit oxygen and therefore, a germanium atom is not oxidized by outside air permeation and consequently, emission can be stabilized and is scarcely deteriorated. Further, silicon oxide, silicon nitride, or silicon oxynitride can be formed into a film in common silicon semiconductor process and is therefore excellent in mass productivity and moreover made possible to be combined with another electronic circuit.

A thickness of the carrier 54 is, for example, 10 nm or thicker and 100 nm or thinner (e.g. in a range between whichever two numerals of 10, 20, 30, 40, 50, 60, 70, 80, 90, and 100 nm).

In this connection, the translucent property in this invention means that capability of transmitting light emitted by the light emitting device 59 of the invention. The light transmittance of the carrier 54 is preferably 50% or higher transmittance of light with a wavelength range of 250 nm or longer and 500 nm or shorter. It is because in a case where the germanium light emitters 55 are fine particles containing GeO and GeO$_2$, since a peak wavelength of light emitted from the germanium light emitters 55 is around 300 and 400 nm, light extraction efficiency can be higher correspondingly as the transmittance of light with a wavelength of 250 to 500 nm is higher.

4-1-9. Germanium Light Emitters

The germanium light emitters 55 may be, for example, fine particles containing GeO and GeO$_2$. In this case, the germanium light emitters 55 may contain germanium (metal).

4-1-10. Method for Using the Light Emitting Device

The light emitting device 59 can emit light by applying a negative voltage to the third electrode 57 and a positive voltage to the translucent electrode 56, and adjusting the fourth electrode at a potential between the third electrode 57 and the translucent electrode 56, for example, earthing it.

An intensity of the voltage to be applied is not particularly limited if it is sufficient for applying an electric field to generate tunnel electric current between the third electrode 57 and the fourth electrode 59 and applying an electric field to supply hot electrons generated by the tunnel electric current to the carrier 54. For example, emission is carried out by applying a voltage of −10V to the third electrode 57 and a voltage of +25V to the translucent electrode 56 and earthing the fourth electrode 58.

In this connection, with respect to the light emitting device 59 of this embodiment, in addition to the emission by hot electrons, emission by FN tunneling may be included.

4-2. Method for Manufacturing the Light Emitting Device 4-2-1. Formation of Substrate The substrate 51 having the p-type semiconductor part 52 and the n-type semiconductor part 53 including pn-junction at least in an upper face is formed. A formation method is not particularly limited; however a mask with a desired from is formed on a p-type silicon substrate and phosphorus, which is an n-type impurity, is ion implanted and thereafter the mask is removed to form a substrate having the p-type silicon and the n-type silicon on the upper face.

4-2-2. Formation of Carrier

The translucent carrier 54 is formed on the substrate 51. For example, it can be formed by depositing silicon oxide or silicon nitride is deposited by CVD or sputtering.

4-2-3. Formation of Germanium Light Emitters

The germanium light emitters 55 are formed in the inside of the carrier 54. A method for forming the germanium light emitters 55 in the inside of the carrier 54 is not particularly limited; however in a case where the germanium light emitters 55 are fine particles containing GeO and GeO$_2$, it is supposed to be a method involving ion implanting germanium in the carrier 54 and thereafter carrying out a heat treatment. Ions are agglomerated by the heat treatment after ion implantation and a large number of fine particles are formed in the carrier 54 Ge is oxidized to form GeO and $GeO_2$.

4-2-4. Formation of Translucent Electrode

The translucent electrode 56 is formed on the carrier 57 in which the germanium light emitters 55 are formed. For example, in a case of an ITO electrode, it can be formed by a coating method, sputtering, or the like.

4-2-5. Formation of Third Electrode and Fourth Electrode

The third electrode 57 is formed on a surface of the p-type semiconductor part 52 and on a part of a surface where the carrier 54 is not formed. Further, the fourth electrode 58 is formed on a surface of the n-type semiconductor part and on a part of a surface where the carrier 54 is not formed. A formation method is not particularly limited; however, for example, the electrodes can be formed by a coating method, sputtering, or the like.

5. CL Experiment

First, a silicon substrate was heat-oxidized at 1050° C. for 100 minutes in oxygen atmosphere to form a silicon heat oxidized film on a surface thereof.

Next, Ge anions were implanted at 50 keV into the silicon heat-oxidized film multiple times while Ge implantation amounts were properly changed for respective devices.

Next, while evacuation was carried out by a rotary pump, nitrogen was introduced and heat treatment was carried out at heat treatment temperatures properly changed for respective devices. During the heat treatment, Ge was oxidized by agglomeration and oxidation of the implanted Ge to form germanium oxide having at least partial oxygen deficiency.

Next, an ITO electrode was formed on the silicon heat-oxidized film and an aluminum electrode was formed in a silicon substrate side to obtain a plurality of light emitting device to be used for the CL experiment.

A CL wavelength was measured in a case where each device was irradiated with electron beam of 5 keV. For CL wavelength measurement, "Mono CL3+ manufactured by Gatan" was used.

Figure 22A:
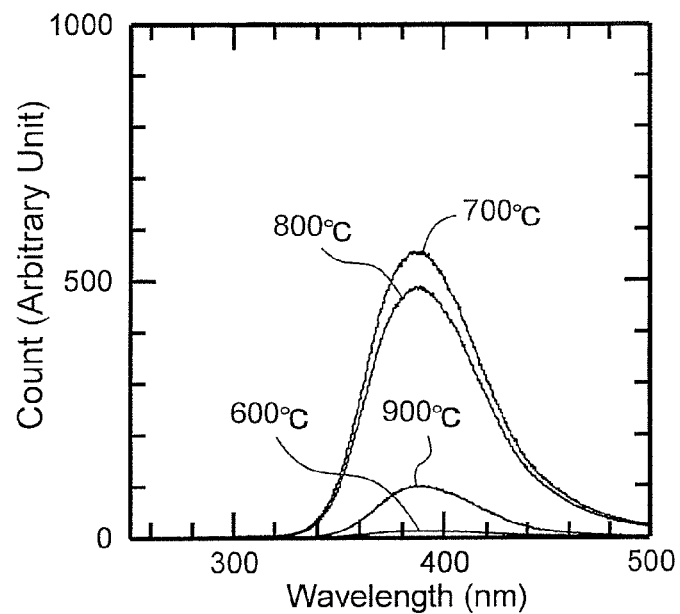
FIG. 22A: a graph showing CL wavelength measurement results of light emitting devices fabricated by carrying out a heat treatment at various temperatures in accordance with the invention.
Figure 22B:
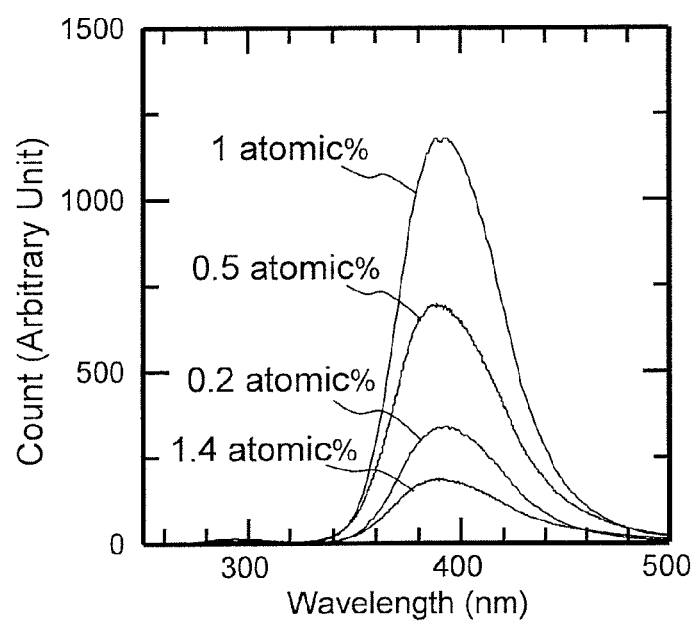
FIG. 22B: a graph showing CL wavelength measurement results of light emitting devices with various Ge concentrations in accordance with the invention.

Obtained results are shown in FIGS. 22A and 22B. Temperature in FIG. 22A shows the heat treatment temperature (time is 1 hour). "% by Atom" in FIG. 22B shows a Ge concentration in the silicon heat-oxidized film after Ge implantation. The Ge concentration was measured by a Rutherford back scattering method using HRBS 5000 manufactured by Kobe Steel, Ltd. Specifically, He ion beam was irradiated at 450 keV and recoil particles were analyzed by using a magnetic field type energy analyzer. A depth distribution of germanium atoms in the silicon oxide film can be calculated based on scattering from silicon atoms in the silicon oxide film. In this experiment, calculation was carried out by employing 2.2 and 2.33 $g/cm^3$ respectively for the silicon oxidation film and the density of silicon. The Ge concentration in FIG. 22A is 0.5% by atom and the heat treatment temperature in FIG. 22B is 800° C. (time is 1 hour).

With reference to FIGS. 22A and 22B, it can be understood that even if the heat treatment temperature or Ge concentration are changed, the peak wavelength of CL is constant and about 390 nm.

Accordingly, it is confirmed that the germanium oxide having oxygen deficiency is relevant to emission of the light emitting device of the invention.

Further, with reference to FIG. 22A, it can be understood that the heat treatment temperature is preferably 700 to 900° C. and more preferably 700 to 800° C. With reference to FIG. 22B, it can also be understood that the Ge concentration is preferably 0.1 to 1.4% by atom and more preferably 0.5 to 1.0% by atom.

What is claimed is:

1. A light emitting device comprising a first electrode, a second electrode, and a carrier formed between the first electrode and the second electrode and containing germanium light emitters, wherein the germanium light emitters contain germanium oxide and partially oxidized germanium which has a lower oxygen ratio than germanium oxide and have a wavelength peak of emission in both or either the range of 250 to 350 nm and/or the range of 350 to 500 nm when a potential difference is applied to the first electrode and the second electrode.

2. The device according to claim 1, wherein the germanium light emitters are germanium fine particles at least partially oxidized.

3. The device according to claim 1, wherein a wavelength peak of cathode luminescence is in the range of 340 to 440 nm at a time when the germanium light emitters are irradiated with 5 eV of electron beam.

4. The device according to claim 1, wherein the germanium light emitters contain the germanium oxide having 10% or more of the oxygen deficiency in the case where the entire germanium oxide contained in the germanium light emitters is determined to be 100%.

5. The device according to claim 1, wherein the germanium light emitters are fine particles each comprising germanium in a center part and germanium oxide in a surrounding of the center part.

6. The device according to claim 5, wherein the fine particles have the maximum particle diameter of 1 nm or larger and 20 nm or smaller.

7. The device according to claim 1, wherein the carrier has a transmittance of light with a wavelength of 250 nm or longer and 350 nm or shorter, or a wavelength of 350 nm or longer and 500 nm or shorter, or both ranges of 50% or higher and 99.99% or lower.

8. The device according to claim 1, wherein the carrier is made of an insulator.

9. The device according to claim 1, wherein the carrier is made of silicon oxide or silicon oxynitride.

10. The device according to claim 1, wherein the germanium light emitters are contained in a region apart at 5 nm or more and 15 nm or less from the first electrode or the source electrode or both electrodes.

11. The device according to claim 1, wherein the first electrode or the second electrode has a transmittance of light with a wavelength range of 250 nm or longer and 350 nm or shorter, a wavelength range of 350 nm or longer and 500 nm or shorter or both ranges of 50% or higher and 99.99% or lower.

12. The device according to claim 1, wherein the first electrode or the second electrode is made of a metal oxide thin film, a metal thin film, or a semiconductor thin film.

13. The device according to claim 1, wherein the first electrode or the second electrode has a perforated structure such as a slit structure or a porous structure.

14. The device according to claim 13, wherein the first electrode or the second electrode is made of conductive nanowires.

15. The device according to claim 1, further comprising a means for limiting the maximum electric current limiting electric current flowing between the first electrode and the second electrode.

16. The device according to claim 15, wherein the means for limiting the maximum electric current is an electric resistor electrically connected with the first electrode or the second electrode.

17. The device according to claim 16, wherein the electric resistor is a variable resistor.

18. The device according to claim 1, wherein the first electrode and the second electrode have contact with the carrier and the first electrode has a plurality of projections on a surface having contact with the carrier and a length between upper ends of the projections and the second electrode is shorter than a length between a part other than the projections of the first electrode and the second electrode.

19. The device according to claim 1, wherein the device further comprises a substrate, the carrier is formed on the substrate and has a first parallel face parallel to a surface of the substrate and second parallel faces lower than the first parallel face in both sides of the first parallel face, the first electrode and the second electrode are formed on the second parallel faces in both sides of the first parallel face, respectively, and the device further comprises a light emitting region formed in the carrier between the first electrode and the second electrode and containing the germanium light emitters and also a translucent protection layer formed on the first electrode, the second electrode, and the first parallel face.

20. The device according to claim 19, wherein the light emitting region is a region parallel to the first parallel face and has a region containing the germanium light emitters in a relatively high density.

21. The device according to claim 19, wherein the protection layer is made of silicon oxide, silicon nitride or silicon oxynitride.

22. The device according to claim 19, wherein the first electrode or the second electrode is made of cobalt silicide, titanium silicide or nickel silicide.

23. The device according to claim 19, wherein the carrier under the second parallel faces has a thickness thicker than the length between the first electrode and the second electrode.

24. The device according to claim 19 further comprising a reflective layer between the substrate and the carrier.

25. The device according to claim 1, wherein the first electrode and the second electrode have contact with the carrier and the first electrode is constituted with a p-type semiconductor part and a n-type semiconductor part both having pn-junction and the device further comprises a third electrode electrically connected with the p-type semiconductor part and a fourth electrode electrically connected with the n-type semiconductor part.

26. The device according to claim 1 to be employed for solid-state illumination.

27. The device according to claim 1 to be employed for a display.

28. A method for using a light emitting device comprising a first electrode, a second electrode, and a carrier formed between the first electrode and the second electrode and containing germanium light emitters, wherein the germanium light emitters contain germanium oxide and partially oxidized germanium which has a lower oxygen ratio than germanium oxide and have a wavelength peak of emission in both or either the range of 250 to 350 nm and/or the range of 350 to 500 nm when a potential difference is applied to the first electrode and the second electrode, the method comprising applying a DC voltage between the first electrode and the second electrode.

29. A method for using a light emitting device comprising a first electrode, a second electrode, and a carrier formed between the first electrode and the second electrode and containing germanium light emitters, wherein the germanium light emitters contain germanium oxide and partially oxidized germanium which has a lower oxygen ratio than germanium oxide and have a wavelength peak of emission in both or either the range of 250 to 350 nm and/or the range of 350 to 500 nm when a potential difference is applied to the first electrode and the second electrode, the method comprising applying an AC voltage between the first electrode and the second electrode.

30. A method for manufacturing a light emitting device comprising a first electrode, a second electrode, and a carrier formed between the first electrode and the second electrode and containing germanium light emitters, wherein the germanium light emitters contain germanium oxide and partially oxidized germanium which has a lower oxygen ratio than germanium oxide and have a wavelength peak of emission in both or either the range of 250 to 350 nm and/or the range of 350 to 500 nm when a potential difference is applied to the first electrode and the second electrode, the method comprising forming a region with 0.1 to 20% by atom of a germanium concentration in the carrier and then carrying out a heat treatment to form the germanium light emitters.

31. The method according to claim 30, wherein the germanium light emitters are formed by making germanium fine particles and thereafter oxidizing the particles.

32. The method according to claim 30, wherein the germanium light emitters are formed by ion implanting germanium anions or neutralized germanium into the carrier and thereafter carrying out a heat treatment.

33. The method according to claim 30, wherein the heat treatment involves a first heat treatment step of heat treating in inert atmosphere and a second heat treatment step of carrying out a heat treatment in oxidizing atmosphere.

34. A method for manufacturing a light emitting device comprising a first electrode, a second electrode, and a carrier formed between the first electrode and the second electrode and containing germanium light emitters, wherein the germanium light emitters contain germanium oxide and partially oxidized germanium which has a lower oxygen ratio than germanium oxide and have a wavelength peak of emission in both or either the range of 250 to 350 nm and/or the range of 350 to 500 nm when a potential difference is applied to the first electrode and the second electrode, wherein the device further comprises a substrate, the carrier is formed on the substrate and has a first parallel face parallel to a surface of the substrate and second parallel faces lower than the first parallel face in both sides of the first parallel face, the first electrode and the second electrode are formed on the second parallel faces in both sides of the first parallel face, respectively, and the device further comprises a light emitting region formed in the carrier between the first electrode and the second electrode and containing the germanium light emitters and also a translucent protection layer formed on the first electrode, the second electrode, and the first parallel face, the method comprising the steps of:

forming a first parallel face and second parallel faces lower than the first parallel face in both sides of the first parallel face by etching a portion of a translucent carrier formed on a substrate;

forming a polysilicon layer on the first parallel face and the second parallel faces;

removing the polysilicon layer on the first parallel face by etching;

forming germanium light emitters in the light emitting region in parallel to the first parallel face by ion implanting germanium ions into the carrier under the first parallel face and thereafter carrying out a heat treatment;

forming a first electrode and a second electrode on the second parallel faces in both sides of the first parallel face by forming a high melting point metal layer on the polysilicon layer and thereafter carrying out a heat treatment; and forming a protection layer on the first electrode, the second electrode, and the first parallel face.

* * * * *